US006066196A

United States Patent [19]
Kaloyeros et al.

[11] Patent Number: 6,066,196
[45] Date of Patent: May 23, 2000

[54] METHOD FOR THE CHEMICAL VAPOR DEPOSITION OF COPPER-BASED FILMS AND COPPER SOURCE PRECURSORS FOR THE SAME

[75] Inventors: Alain E. Kaloyeros, Slingerlands, N.Y.; Barry C. Arkles, Dresher, Pa.

[73] Assignees: Gelest, Inc., Tullytown, Pa.; The Research Foundation of State University of New York, Albany, N.Y.

[21] Appl. No.: 09/157,901

[22] Filed: Sep. 21, 1998

Related U.S. Application Data

[63] Continuation of application No. 09/157,236, Sep. 18, 1998.
[51] Int. Cl.$^7$ ............................... C09D 5/00; C07F 1/08
[52] U.S. Cl. .................. 106/1.18; 106/1.26; 106/287.18; 556/40
[58] Field of Search ................................. 106/1.18, 1.26, 106/287.18; 556/40; 427/250

[56] References Cited

U.S. PATENT DOCUMENTS

| | | |
|---|---|---|
| Re. 35,614 | 9/1997 | Norman et al. . |
| 5,085,731 | 2/1992 | Norman et al. . |
| 5,096,737 | 3/1992 | Baum et al. . |
| 5,098,516 | 3/1992 | Norman et al. . |
| 5,144,049 | 9/1992 | Norman et al. ........................... 556/12 |
| 5,145,714 | 9/1992 | Reisman et al. . |
| 5,187,300 | 2/1993 | Norman . |
| 5,220,044 | 6/1993 | Baum et al. .............................. 556/40 |
| 5,273,775 | 12/1993 | Dyer et al. . |
| 5,744,192 | 4/1998 | Nguyen et al. . |
| 5,767,301 | 6/1998 | Senzaki et al. . |
| 5,817,367 | 10/1998 | Chun et al. . |
| 5,820,664 | 10/1998 | Gardiner et al. ................... 106/287.17 |

OTHER PUBLICATIONS

Zheng, et al, "Device–quality copper using chemical vapor deposition of β–diketonate source precursors in liquid solution", Appl. Phys. Lett., vol. 61, No. 18, (1992), pp. 2175–2177.

Stephen M. Fine, et al, "Organometallic Chemical Vapor Deposition of Copper from a New Organometallic Precursor", Mat. Res. Soc. Symp. Proc. vol. 204 (1991), pp. 415–419.

Shine et al, "Synthesis of New Copper (I) β–Diketonate Compounds for CVD of Copper," Mat. Res. Soc. Symp. Proc. vol. 204 (1991), 421–426.

Alain E. Kaloyeros, et al. "Chemical Vapor Deposition of Copper for Multilevel Metallization," MRS Bulletin, (1993), pp. 22–29.

A. Jain, et al., "Selective CVD of Copper on Tungsten Versus Sio$_2$ from (B–diketonate)cul$_n$ Copper (I) Precursors Via Sio$_2$ Surface Modification," Conference Proc. ULSI–VIII (1993) Materials Research Society, pp. 83–89.

J.A.T. Norman, et al., "Chemical additives for improved copper chemical vapour deposition processing", Thin Solid Films 262 (1995), pp. 46–51.

M.B. Naik, et al., "CVD of copper using copper (I) and copper (II) β–diketonates," Thin Solid Films 262 (1995), pp. 60–66.

J.A.T. Norman, et al., "A new metal–organic chemical vapor deposition process for selective copper metallization," Materials Science and Engineering, B17 (1993), pp. 87–92.

A. Jain, et al., "Chemical Vapor Deposition of Copper from Hexafluoroacetylacetonato Copper (I) Vinyltrimethylsilane," J. Electrochem. Soc., vol. 140, No. 5, May 1993, pp. 1434–1439.

G.A. Petersen, et al., "Enhanced Chemical Vapor Deposition of Copper from (hfac)Cu(TMVS) Using Liquid Coinjection of TMVS," J. Electrochem. Soc., vol. 142, No. 3, Mar. 1995, pp. 939–944.

S.M. Fine, et al., "Consecutive Selective Chemical Vapor Deposition of Copper and Aluminum from Organometallic Precursors," Mat. Res. Soc. Symp. Proc. vol. 282, (1993), pp. 329–334.

D. P. Tracy, et al., "Texture and Microstructure of Thin Copper Films," J. Electronic Materials, vol. 22, No. 6, 1993, pp. 611–616.

H.K. Shin, et al., "MOCVD of Copper from New and Liquid Precursors (hfac)CuL, where L=1–pentene, ATMS, and VTMOS," Mat. Res. Soc. Symp. Proc. vol. 427 (1996), pp. 219–223.

J. Nucci, et al., "In–situ Analysis of the Microstructure of Thermally Treated Thin Copper Films," Mat. Res. Soc. Symp. Proc. vol. 309 (1993), pp. 377–382.

S.P. Murarka, et al., "Advanced multilayer metallization schemes with copper as interconnection metal," Thin Solid Films, 236 (1993), pp. 257–266.

Jung–Chao Chiou, et al., "The Processing Windows for Selective Copper Chemical Vapor Deposition from Cu(hexafluoroacetylacetonate)trimethylvinylsilane," J. Electrochem. Soc., vol. 142, No. 1, (1995), pp. 177–182.

N. Awaya, et al., "Deposition Mechanism of Copper CVD," Adv. Met. For ULSI Appl. MRS (1992), pp. 345–353.

T. Welton, et al., "MOCVD of Copper on Tungsten: Carbon Contamination at the Interface," Adv. Met. For ULSI Appl., MRS (1992), pp. 383–388.

(List continued on next page.)

*Primary Examiner*—Roy V. King
*Attorney, Agent, or Firm*—Akin, Gump, Strauss, Hauer & Feld, L.L.P.

[57] ABSTRACT

A method for depositing copper-based films and a copper source precursor for use in the chemical vapor deposition of copper-based films are provided. The precursor includes a mixture of at least one ligand-stabilized copper (I) β-diketonate precursor; and at least one copper(II) β-diketonate precursor. The method includes introducing into a deposition chamber: (i) a substrate; (ii) a copper source precursor in a vapor state including a mixture of at least one ligand-stabilized copper (I) β-diketonate precursor; and at least one copper(II) β-diketonate precursor; and (iii) at least one transport gas, different than said copper source precursor. The reaction substrate temperature is maintained at from about 50° C. to about 500° C. for a period of time sufficient to deposit a copper-based film on said substrate.

11 Claims, 10 Drawing Sheets

OTHER PUBLICATIONS

S. Poston, et al., "Density Determination of Silver Neodecanoate, Tungsten Hexacarbonyl, and a Series of Metal Acetylacetonate and Hexafluoroacetylacetonates", J. Electronic Materials, vol. 18, No. 1, (1989), pp. 79–84.

C. Oehr, et al., "Thin Copper Films by Plasma CVD Using Copper–Hexafluoro–Acetylacetonate", Appl. Phys., A 45, 151–154 (1988).

R. L. Van Hemert, et al., "Vapor Deposition of Metals of Hydrogen Reduction of Metal Chelates", J. Electrochem. Soc., vol. 112, (1963), pp. 1123–1125.

Chih–Chen Cho, "Enhanced Chemical Vapor Deposition of Copper", Conf. Proc., VLSI VI (1991) pp. 189–194.

A. V. Gelatos, et al., "Chemical Vapor Deposition of Copper from $Cu^{+1}$ precursors in the Presence of Water Vapor", Appl. Phys. Lett., vol. 63, No. 20, (1993), pp. 2842–2844.

A. Jain, et al., "Selective and blanket copper chemical vapor deposition for ultra–large–scale integration", J. Vac. Sci. Technol. B., vol. 11, No. 6 (1993), pp. 2107–2113.

H. Li, et al., "Remote plasma chemical vapor deposition of copper for applications in microelectronics", J. Vac. Sci. Tehcnol. B., vol. 10, No. 4 (1992), pp. 1337–1340.

E.T. Eisenbraun, et al., "Enhanced growth of device–quality copper by hydrogen plasma–assisted chemical vapor deposition," Appl. Phys. Lett., vol. 60, No. 25 (1992) pp. 3126–3128.

SLA Semiconductor Industry Association–The National Technology Roadmap for Semiconductors, 1994 (pp. 94–99).

P. Jeffries, Chemical Vapor Deposition of Copper and Copper Oxide Thin Films from Copper (I) tert–Butoxide, *Chem. Of Materials* vol. 1, pp. 8–12 (1989).

METHOD FOR THE CHEMICAL VAPOR DEPOSITION OF COPPER-BASED FILMS AND COPPER SOURCE PRECURSORS FOR THE SAME

CROSS-REFERENCE TO RELATED APPLICATION

This application is a continuation of co-pending application Ser. No. 09/157,236, filed Sep. 18, 1998, entitled Method For The Chemical Vapor Deposition Of Copper-Based Films And Copper Source Precursors For The Same. The entire disclosure of application Ser. No. 09/157,236 as filed is incorporated herein by reference.

BACKGROUND OF THE INVENTION

Computer chip evolution continues to be driven by a need to develop higher speed, increased functionality, and improved reliability. This need requires the development of new chip architectures with higher integration density, i.e., more devices per chip, and miniaturized design rules having smaller device features.

With the introduction of ultra-large scale integration (ULSI), where device features are in the sub-quarter-micron dimension, new interconnect metals and associated processes are being heavily investigated for potential incorporation in the fabrication of the ULSI multilevel metallization (MLM) schemes required. Of these interconnect metals and processes, the chemical vapor deposition (CVD) of copper appears to be one of the most promising approaches. Copper exhibits a lower resistivity (bulk resistivity of 1.68 $\mu\Omega$cm) than aluminum, which would be expected to yield significant reduction in RC time delay, where RC=resistance× capacitance. It is also predicted to display enhanced electromigration and stress resistance which would lead to higher reliability and improved device performance. In addition, CVD displays an intrinsic potential for void-free filling of aggressive via and hole structures at near bulk resistivity and high growth rates.

CVD growth of copper has been reported using both the copper (I) and copper (II) classes of source precursors, (I) and (II) referring to the respective oxidation states of copper, i.e., $Cu^{+1}$ and $Cu^{+2}$. Each class of precursors has its marked characteristics and specific decomposition pathways. Preferred copper (I) precursors are liquid at room temperature, which ensures their controlled and accurate delivery to the CVD reactor. Additionally, copper (I) precursors exhibit high volatility, leading to copper deposition at high growth rates. It is also accepted that these sources decompose by disproportionation which is illustrated, for example, in the reaction formula shown below where the reaction pathway proceeds from left to right:

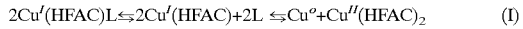

In the above formula (I), L is a Lewis base neutral ligand such as trimethylvinylsilane (TMVS) and HFAC is hexafluoroacetylacetonate. The ligand base L is weakly coordinated to the copper(I)(hexafluoroacetylacetonate) molecule, and easily uncouples from the remainder of the molecule, leaving copper(I)(hexafluoroacetylacetonate) as an intermediate species. The rate-limiting step in the Formula (I) is thus the adsorption of copper(I)(hexafluoroacetylacetonate) to substrate surface sites, where electron exchange between metallic centers is easily catalyzed by electrically active sites of the conducting substrate surface leading to the second reaction step in Formula (I) above. The disproportionation reaction is catalyzed by metallic or other electrically conducting portions of the substrate surface at temperatures from 110° C. to 190° C. This leads, in principle, to selective copper deposition on the conducting, but not insulating, areas of the substrate. See, e.g., U.S. Pat. No. 5,098,516 of Norman et al.

Molecular recombination, as shown in Formula (I) moving in the reverse direction from right to left, is also feasible in the case of copper(I) source precursors. The occurrence of molecular recombination has been demonstrated through a variety of studies, including the successful etching of deposited copper using a mixture of copper(II)(hexafluoroacetylacetonate)$_2$ and trimethylvinylsilane at 140° C., and the demonstration of reversibility of copper growth from copper(I)(hexafluoroacetylacetonate) (trimethylvinylsilane). See, e.g., M. Naik et al., *Thin Solid Films*, 262, p. 62 (1995) and Norman et al., *J. Physics*, IV, p. C2–271 (1991).

It is also believed that, if hydrogen is present during the reaction, the decomposition of the copper(I) source precursors could additionally occur through a reduction pathway as shown in formula (II):

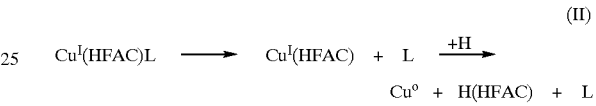

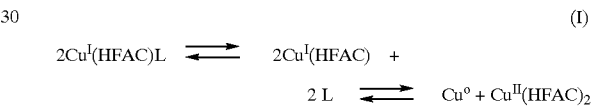

Copper(II) sources, in contrast, are easily reduced by hydrogen either thermally (at temperatures above about 250° C.) on a catalyzing substrate or in a plasma environment (at temperatures as low as 100° C.), to yield pure copper according to a process as shown in Formulae (III) and (IV) below, for the case of anhydrous copper(II)(hexafluoroacetylacetonate)$_2$:

As a copper source, copper(II)(hexafluoroacetylacetonate)$_2$ has demonstrated the ability to produce high electrical quality copper films, with as-deposited resistivities of 1.7 $\mu\Omega$cm. Copper (II) sources are also known to be robust, non-air-sensitive, and easy to synthesize and handle.

Unfortunately, each class of precursors suffers from some shortcomings which inhibit its adaptability to semiconductor manufacturing practices. Copper (I) sources are reported to be highly air-sensitive and exhibit poor transport properties, with pure copper(I)(hexafluoroacetylacetonate) (trimethylvinylsilane), for example, exhibiting a narrow delivery window of about 55±5° C. Lower temperatures cause precursor condensation in the delivery lines, while higher temperatures lead to its premature decomposition during transport to the reactor. Additionally, the synthesis of copper (I) sources is not straightforward, and tends to produce films of lower electrical quality. For example, thermal CVD from pure copper(I)

(hexafluoroacetylacetonate) (trimethylvinylsilane) has been unsuccessful at producing as-deposited copper resistivities lower than 2.0 $\mu\Omega$cm.

Efforts to resolve these issues have focused on doping pure copper(I)(hexafluoroacetylacetonate) (trimethylvinylsilane) with chemical additives to improve its stability and performance. In this context, the addition of trimethylvinylsilane to the source precursor led to more stable delivery to the CVD reactor at appreciable flow rates, while the incorporation of H(HFAC) produced smoother copper films at higher growth rates than in the case of copper(I)(hexafluoroacetylacetonate) (trimethylvinylsilane) without additives See, e.g., Norman et al., *Thin Solid Films*, 262, p. 46 (1995). Also, the inclusion of water vapor in the CVD process produced significant enhancement in copper growth rates. See, e.g., Gelatos et al., *Appl. Phys. Lett.* 63, p. 2842 (1993) and Norman et al., *Process Semiconductor Research Corporation Workshop On Copper Interconnect Technology*, Troy, N.Y. (August 1993), SRC, Research Triangle Park, N.C. (1993), p. 130. However, these approaches led to increased precursor cost and complexity, and have not yet produced the precursor reliability and suitability for manufacture desired.

From a processing perspective, the disproportionation reaction involved in the thermal CVD of copper from copper (I) sources is inefficient, with one copper atom being deposited on the substrate for every two copper atoms provided to the reaction, as can be seen in Formula (I) for copper(I) (hexafluoroacetyl acetonate)(trimethylvinylsilane). The second copper atom is removed from the reaction zone in the form of a copper(II)β-diketonate precursor, such as copper (II)(hexafluoroacetylacetonate)$_2$.

Copper (II) sources, in contrast, have lower volatility than copper (I) sources, which leads to reduced copper growth rates and the inability to completely fill the aggressive topographies associated with emerging semiconductor integrated circuit technologies. Also, these sources tend to be solid at room temperature, which poses significant challenges to their accurate and controllable delivery to the reaction zone. Their decomposition in thermal CVD processing tends to occur at higher temperatures than their copper (I) counterparts, with the decomposition of copper (II)(hexafluoroacetylacetonate)$_2$, for example, occurring above about 250° C. Conventional plasma-assisted CVD in a hydrogen plasma successfully reduced these temperatures to below 150° C. However, plasma-promoted CVD without a bias substrate failed to achieve complete fill of aggressive device topographies. The introduction of a bias substrate is expected to enhance the probability of precursor species adsorption and re-emission within such topographies, leading to improved fill characteristics. However, it adds a level of process and equipment complexity which is technologically and economically viable only if no simpler solutions are found. As such, there is a need in the art to develop a simpler, more economical process. Plasma-assisted CVD is described in A. E. Kaloyeros et al., "Copper CVD for Multilevel Interconnect in ULSI," *MRS Bulletin*, vol. 18 (1993), p. 22; B. Zheng et al., "New Liquid Delivery System for CVD of Copper from β-diketonate Precursors," *Appl. Phys. Lett.*, vol. 61 (1992), p. 2175 and H. Li et al., "remote Plasma CVD of Copper for Applications in Microelectronics," *J Vac. Sci. Technol.*, vol. B10 (1992), p. 1337.

There is a need in the art to develop a copper source chemistry and associated CVD deposition process which provides planarized and void-free copper fill of aggressive sub-quarter-micron structures with as-deposited resistivity near the bulk resistivity, particularly structures of $\leq 0.25$ $\mu$m with an aspect ratio of 4:1 and beyond, where the aspect ratio is defined as the height of a hole or via measured longitudinally divided by the width or diameter of the hole or via measured transversely. Such criteria must be met in order to provide industrially acceptable wafer throughput and associated reliability, including the ability to process up to 5,000 wafers without tool downtime resulting from precursor condensation or premature decomposition in the delivery lines, or tool contamination from precursor species and associated by-products.

There is further a need in the art for a copper source chemistry which possesses high volatility, significant vapor pressure, and a high vaporization and sublimation rate to ensure an industrially acceptable wafer throughput. It would be particularly of interest to develop such a copper source in liquid form given the advantages of being able to use liquid delivery systems, such as the MKS direct liquid injection (DLI) system, which would ensure highly accurate, controllable and reproducible precursor liquid delivery into the reaction zone. There is also a need for a chemically and environmentally stable copper source which allows for extended shelf life and ease in transport and handling. Such a copper source chemistry should also be economical to use with respect to synthesis, mass production, disposal and the cost of start-up materials.

Multiple distillation steps are required to produce pure copper(I)(hexafluoroacetylacetonate)(trimethylvinylsilane) for use in forming films, and additional distillation steps significantly increases the cost of the precursor. Such cost problems become even more significant when doping using chemical additives is undertaken to improve the stability and performance of the pure copper(I) (hexafluoroacetylacetonate) (trimethylvinylsilane). As such, there is also a need in the art for a copper source chemistry which can be utilized as synthesized without the time and yield loss associated with distillation and doping steps thereby reducing the overall process cost.

Prior art selective copper CVD processes are not feasible within the constraints imposed by current manufacturing practices in view of the need to use ultra-clean sample preparation and associated processing conditions to ensure selectivity. Therefore, as an alternative, there is a need in the art for a CVD process and copper source precursor which provides a copper growth process independent of the type of substrate used. It would also be desirable for such a process to be able to deposit copper on various substrates, including non-conducting surfaces, such as amorphous diffusion barriers, or adhesion promoters which tend to be electrically semiconducting or insulating. As noted above, the disproportionation reaction which occurs in thermal CVD of copper from copper(I) sources "wastes" one copper atom in the form of a $Cu^{II}$ β-diketonate precursor for every two copper atoms provided to the reaction. As such, there is further a need in the art for a copper source precursor which incorporates both copper atoms from the disproportionation reaction in the growing copper film.

BRIEF SUMMARY OF THE INVENTION

The present invention includes a copper source precursor for use in the chemical vapor deposition of films comprising copper, comprising a mixture of (a) at least one ligand-stabilized copper (I) β-diketonate precursor; and (b) at least one copper (II) β-diketonate precursor.

In one embodiment, the invention includes a copper source precursor for use in the chemical vapor deposition of films comprising copper, comprising a mixture of (a) at least one ligand-stabilized copper(I) β-diketonate precursor having the following formula:

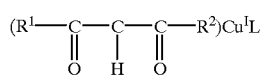

(V)

wherein $R^1$ and $R^2$ are independently selected from the group consisting of linear and branched alkyl groups of from 1 to 6 carbon atoms, and fluorine-substituted linear and branched alkyl groups of from 1 to 6 carbon and/or fluorine atoms, and L is a Lewis base selected from the group consisting of alkenes, alkynes, phosphines, carbonyl, polyethers, and cyclopolyethers; and (b) at least one copper (II) β-diketonate precursor having the following formula:

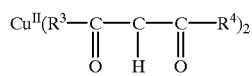

(VI)

wherein $R^3$ and $R^4$ are independently selected from the group consisting of linear and branched alkyl groups of from 1 to 6 carbon atoms, and fluorine-substituted linear and branched alkyl groups of from 1 to 6 carbon and/or fluorine atoms, wherein the at least one copper(II) β-diketonate precursor is at least 1 percent by volume of said mixture.

The invention further includes a method for the chemical vapor deposition of a copper-based film onto a substrate. The method comprises (a) introducing into a deposition chamber: (i) a substrate; (ii) a copper source precursor in a vapor state, wherein the copper source precursor comprises a mixture of at least one ligand-stabilized copper(I) β-diketonate precursor and at least one copper (II) β-diketonate precursor; and (iii) at least one transport gas; and (b) maintaining a reaction substrate temperature of from about 50° C. to about 500° C. for a period of time sufficient to deposit a copper-based film on the substrate.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
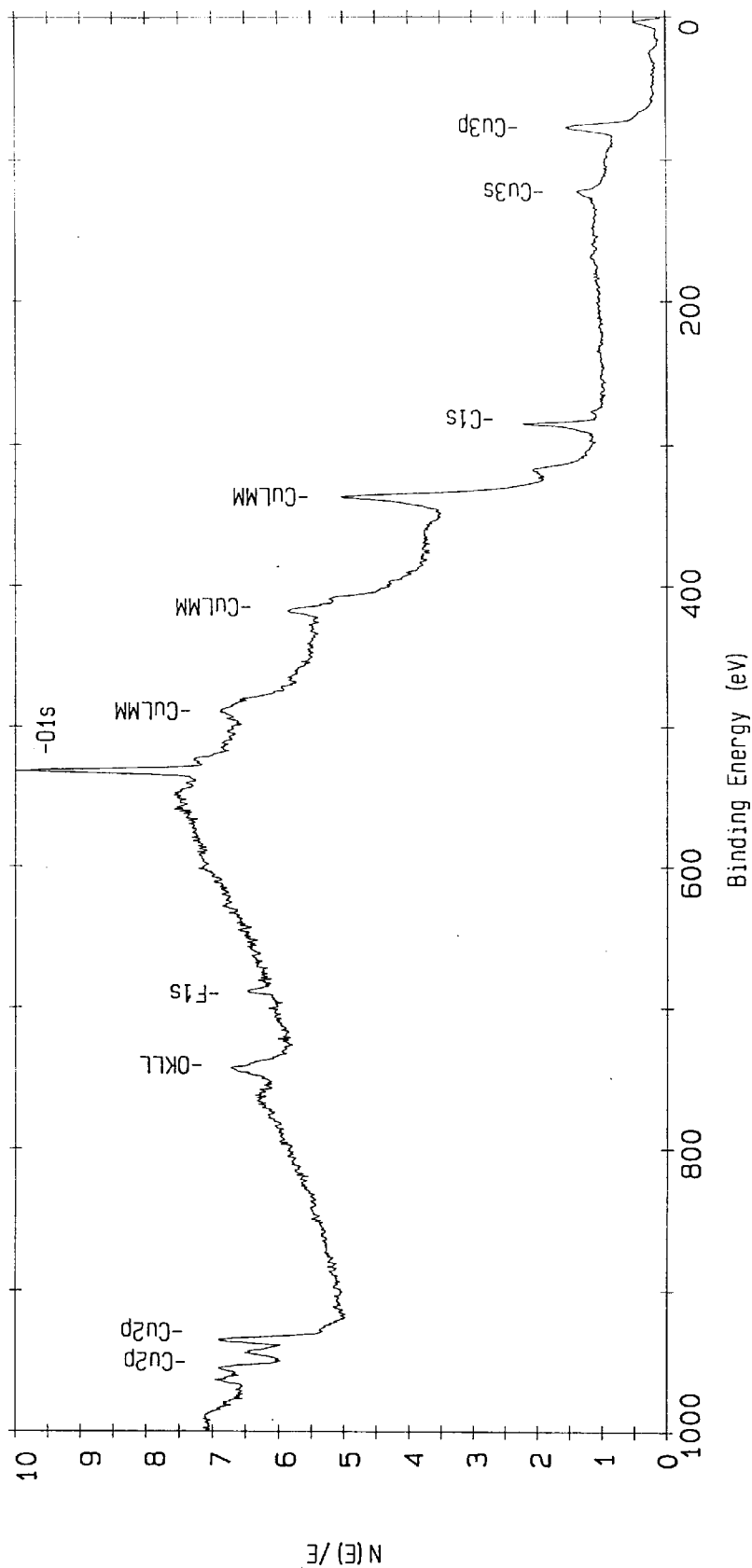
FIG. 1 is a representation of a survey x-ray photoelectron spectroscopy (XPS) spectrum of a copper film produced as described in Example 2 according to one embodiment of the present invention.

The invention relates to chemical sources and associated plasma and thermal chemical vapor deposition methods for the high deposition rate chemical vapor deposition of conformal copper-based films, including pure copper, on substrates, such as specialty substrates. The invention includes novel copper source precursors for depositing copper metallization layers on blanket and patterned semiconductor substrates, such as silicon and gallium arsenide, including patterns having sub-micron features and structures. The invention includes a method for depositing copper on substrates which already have coatings of single or multilayered metallic coatings. As such, multilayered depositions can be performed ex situ, either in the same reactor or in two or more separate reactors, or in situ, either in the same reactor or in two or more separate reactors, each used for deposition of one or more of the multilayered metallic coatings and for deposition of the copper-based film. If more than one reactor is used, the reactors may be interconnected through leak-tight transfer arms and load locks which allow sample transfer between the different reactors without exposure to air. The invention may also be used for coating substrates, such as stainless steel, glass, plastic, and polymers, for applications such as anti-reflective coatings, cosmetic coatings, and for coating substrates, such as copper alloys, for flat panel display and solar cell device applications.

A highly efficient deposition of copper can be achieved using copper(II) β-diketonates which have admixed with them sufficient quantities of a ligand-stabilized copper (I) β-diketonate species to disrupt crystallinity and enhance volatility thereby catalyzing the decomposition of the copper (II) species at low temperature and leading to deposition of copper-based films including pure copper at high growth rates. Copper (II) precursors have demonstrated the ability to produce high electrical quality copper films, with as-deposited resistivities of 1.7 $\mu\Omega$cm. However, precursor transport and conformality, i.e., fill in sub-micron device structures, have to date been inadequate. By incorporating a sufficient amount of copper (I) with copper(II) species, crystallinity is reduced and the copper(II) species is essentially dissolved allowing for more efficient vaporization and transport. In order to facilitate delivery and better incorporate the copper(I) species with the copper(II) species, a weakly coordinating solvent may be used, such as a diene, silylated olefin, acetylene or an unsaturated ether.

The mixtures further provide a stabilized intermediate species in the CVD reactor environment that acts to funnel the copper (II) species through a copper(I) species in a reductive environment. That is, as the copper (I) species proceeds to copper(0), it vacates a stabilizing coordination sphere which can be replenished as copper (II) is reduced.

The invention also allows for blanket CVD deposition of pure copper on conducting as well as insulating surfaces by combining the disproportionation process of copper(I) precursors with the reduction process of the copper (II) precursors. As a result, atomic hydrogen could be absorbed to both conducting and insulating surfaces thereby providing a reduction pathway for copper(I) intermediates such as copper(I)(hexafluoroacetylacetonate).

The copper source precursors of the invention include a mixture of at least one ligand stabilized copper(I) β-diketonate precursor and at least one copper(II) β-diketonate precursor for use in the low temperature growth of copper-based films such as pure copper, carbon-doped copper, and fluorine-doped copper depending on the reactants used with the precursors. The precursor mixture is used in the vapor state. The copper(I) β-diketonates preferably have the following formula:

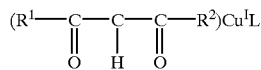
(V)

wherein $R^1$ and $R^2$ are independently selected and may be the same or different, linear or branched alkyl groups of from 1 to 6 carbon atoms, and/or fluorine-substituted linear or branched alkyl groups of from 1 to 6 carbon and/or fluorine atoms. For example, $R^1$ and $R^2$ may be groups such as —CH$_3$, —CF$_3$, —CF$_2$CF$_3$, —CF$_2$CF$_2$CF$_3$, —CH$_2$CH$_2$CF$_3$ and C(CH$_3$)$_3$ and the like. In formula (V), L is a Lewis base which is preferably a two electron donor ligand which may be any suitable "soft" Lewis base, for example, straight chain and cyclic alkenes, such as trimethylvinylsilane, vinyltrimethoxysilane, 1-methene, 1-ethene, 1-propene, 1-butene, 1-pentene, 1,5-cyclooctadiene and similar alkenes; alkynes, such as 3-hexyne, butadiyne, bis-trimethylsilylbutadiyne; phosphines, such as trimethylphosphine; carbonyls, such as acetyltrimethylsilane; polyethers, such as 18-crown-6 and diallylether of ethylene glycol. It should be understood by one skilled in the art, based on this disclosure, that other aprotic or "soft" bases may be used as ligands to stabilize the copper(I) β-diketonates within the scope of the invention and the above list is intended for exemplary purposes only.

Preferred examples of suitable ligand-stabilized copper(I) β-diketonate precursors for use in the precursor mixtures of the present invention include copper(I)(hexafluoroacetylacetonate)(trimethylvinylsilane) and copper(I)(hexafluoroacetylacetonate)(vinyltrimethoxysilane) and mixtures of these compounds.

The copper(II) β-diketonate precursors useful in the present invention preferably having the following formula:

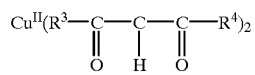
(VI)

wherein $R^3$ and $R^4$ are independently selected and may be the same or different, linear or branched alkyl groups of from 1 to 6 carbon atoms and/or fluorine-substituted linear and branched alkyl groups of from 1 to 6 carbon and/or fluorine atoms. Examples of such groups are provided above with respect to $R^1$ and $R^2$.

Preferred examples of suitable copper(II) precursors include anhydrous copper(II)(hexafluoroacetylacetonate)$_2$, copper(II)(hexafluoroacetylacetonate)$_2$ dihydrate, copper (II)(tetramethylheptadionate) and mixtures of these compounds.

While not wishing to be bound by theory, it is believed that the efficacy of the mixture is attributed to its ability to combine the advantages of both copper(I) and copper(II) complexes, while minimizing or inhibiting their respective disadvantages. Regarding copper(I) sources, the addition of copper (II) complexes contributes to the elimination of the premature disproportionation reaction, as shown in Formula (I) herein, of the copper(I) source during precursor delivery which leads to stable copper(I) complex delivery performance in the vapor phase. Because the metallization reaction of Formula (I) results in the formation of copper(II) complexes as byproducts, the addition of copper(II)complexes to the copper(I) source precursor prior to vaporization is believed to create a saturated equilibrium in the vapor solution which provides a recombination pathway of any disproportionated copper(0) metal vapor and copper(II) complex in a reverse disproportionation reaction as follows:

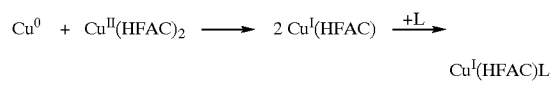
(VI)

The copper(I) and copper(II) precursor mixture can also be vaporized at higher temperatures than those used for pure copper(I) sources, which leads to a wider delivery window and increased precursor flux into the reaction zone, which results in enhanced copper deposition rates.

Addition of copper(II) complexes to copper(I) source precursors also allows for extended shelf life and enhanced chemical stability, in view of the robust nature and stability in air of copper(II) β-diketonates. For copper(II) chemistry, the incorporation of a sufficient amount of copper(I) species into the copper(II) compound, that is, the dissolving of a copper(II) compound in a copper(I) liquid source, reduces crystallinity and enhances volatility. To facilitate delivery, it is desirable to have a weakly coordinating solvent which could be a diene, a silylated olefin, an acetylene such as acetyltrimethylsilane or an unsaturated ether such as diallylether of ethylene glycol. The inclusion of the copper(I) complexes with the copper(II) compounds provides for the formation of stabilized intermediate species in the CVD reactor environment that can funnel the copper (II) species through a copper (I) species in the reductive environment. That is, as the copper(I) species proceeds to copper (0), a stabilizing coordination sphere is vacated which can be replenished as copper (II) is reduced.

The synthesis is highly reproducible and allows for use of the copper source precursor mixture as formed, under the CVD processing conditions of the invention as discussed below, without the need for multiple distillation steps that are presently required to produce films using only copper(I) sources, where each distillation step represents significant increase in precursor cost. The mixture also eliminates the need for doping pure copper(I) precursors with chemical additives to improve their stability and performance which decreases the cost of the synthesis, mass production, and disposal of the copper source chemistry and the associated start-up materials, providing an overall economically viable process for CVD deposition of copper-based films.

Use of the copper source precursor mixture also provides a copper growth process which is relatively independent of the type of substrate used. This is desirable because selective copper CVD processes available in the prior art are not feasible within the constraints imposed by prevailing manufacturing practices, particularly with respect to the need for ultra clean room sample preparation and associated processing conditions to ensure selectivity. Further, the disproportionation reaction involved in thermal CVD using only copper(I) sources wastes a copper atom for every two copper atoms provided to the reaction in the form of byproducts. The use of the mixture according to the invention leads to incorporation of both copper atoms in the growing copper-based film by combining the disproportionation and/or reduction of the copper (I) precursor with the reduction of the copper(II) source, thereby leading to enhanced precursor conversion efficiency.

The precursors may be used to provide conformal copper-based films on blanket substrates (non-patterned) and patterned substrates which have sub-micron features and structures. The films are useful on such substrates as a result of their ability to completely fill the aggressive device features of emerging integrated circuitry technologies. Such films may be used for signal-carrying conductors across each metallization level in a computer chip (interconnects) or for signal-carrying conductors that connect two different levels in a computer chip (plug). The conformal films are also useful as seed layers for deposition of metals by plating techniques, including deposition of copper by electroless plating where the seed layer is necessary to activate the electroless deposition of copper. As used herein, "conformal" coating means a coating which evenly covers a substrate having a complex topography. The evenness of the coating can be measured by, for example, examining the thickness of the coating along the walls and bottom of the hole in the substrate, and determining the variation in the thickness of the coating. According to the invention, sub-quarter-micron substrates are conformally coated when the coating has a thickness, measured at any point normal to the surface of a wall or floor of a hole in the surface of the substrate, which is within 25% of the thickness at any other point in the hole. Preferably, the variation of coating thickness of deposited copper-based films formed using the precursors of the invention is within 10%, that is, at no point is the thickness of the coating either 10% greater or 10% smaller than the average coating thickness.

As used herein, "step coverage," particularly with respect to ULSI devices and coated substrates therein, refers to the ratio of the coating thickness at the bottom of a feature such as a trench or via, to the thickness of the coating on the top surface of the substrate adjacent to the feature, where the ratio is multiplied by 100 to provide a percentage value. The process of the invention and deposited copper films formed from the precursors of the invention have conformal or complete filling of complex substrate topographies depending on the intended use of the substrate.

In integrated circuit applications, a preferred substrate which may be coated with the copper-based films formed from the precursors of the present invention is intended to become an integrated circuit and has complex topography including holes, trenches, vias and the like for providing the necessary connections between materials of various electrical conductivities that form a semiconductor device. Other substrates which may be used with the precursors are preferably intended for ultra-large scale integration (ULSI) integrated circuit technologies and are also patterned with holes, trenches, and other features with diameters of less than 1.0 micron, and often less than 0.5 microns, and even 0.25 microns or less. Such substrates having such small features are known as "sub-quarter-micron" substrates. Sub-quarter-micron substrates which may have copper-based films deposited on them in accordance with the present invention include those having features with high aspect ratios of from about 3:1 to about 6:1 or more, where the aspect ratio is defined as the ratio of the depth of a feature to its diameter as viewed in cross-section. In this disclosure, "sub-quarter-micron substrates" have feature diameters less than about 0.25 microns and an aspect ratio of typically larger than about 3:1. Those of aspect ratios of about 4:1 and greater are associated with substrates for ULSI circuitry.

Exemplary substrate types which may be coated with deposited copper-based films formed using the precursors of the present invention include blanket and patterned semiconductor substrates, such as silicon and gallium arsenide. Substrates already coated with single or multilayered metallic coatings such as adhesion promotor layers or barrier layers may also be further coated with deposited copper-based films formed using the precursors of the invention. Such metallic coatings may include tungsten (W), tantalum (Ta), titanium (Ti) and their binary, ternary and quaternary phases, such as tungsten nitride ($WN_x$), tantalum nitride ($TaN_x$), titanium nitride ($TiN_x$), titanium nitride silicide ($TiN_xSi_y$) and tantalum nitride silicide ($TaN_xSi_y$) where x and y may have values ranging from, respectively, 0 to 2 and 0 to 3. The copper-based films may be deposited first and then coated by deposition with the metallic coatings or the copper-based films may be deposited on the metallic coatings. In addition, either or both types of films may be deposited in any sequence or alternately layered. Such depositions may be performed ex situ, in different reactors, or in situ, either in the same or in two or more separate reactors, each for deposition of one of the multilayered metallic coatings or for the copper-based films. If one reactor is used, the reactors could be interconnected through leak-tight transfer arms and load locks which allow sample transfer without exposure to air.

Other substrates which may be coated with copper-based deposited films formed from the novel precursor mixtures of the invention include silicon dioxide, silicon nitride, or doped versions and mixtures thereof; low dielectric constant (K) insulator materials having K<4.0, which are potential substitutes for silicon dioxide in emerging ULSI circuitry; titanium-based, tungsten-based, and tantalum-based diffusion barriers or adhesion promoter liners, including pure tantalum, tungsten and titanium and their binary, ternary and quaternary alloys; metals, such as aluminum, beryllium, cadmium, cerium, chromium, cobalt, tungsten, gallium gold, iron, lead, manganese, molybdenum, nickel, palladium, platinum, rhenium, rhodium, silver, stainless steel, steel, iron, strontium, tin, titanium, zinc, zirconium, and alloys and compounds thereof such as silicides, carbides, and nitrides; glass; plastic; or other polymers for applications including automotive parts and engines, cutting tools, cosmetic coatings for jewelry, and multilayered films for flat panel display, solar cell devices, and optoelectronic applications.

It should be understood, based on this disclosure that other substrates may be used which would benefit from the application of a copper-based film formed by chemical vapor deposition are within the scope of the invention. However, it is preferred that the substrate used with the precursor mixture of the present invention be stable at the conditions as described herein for depositing copper-based films on the substrate. The substrate should preferably be stable at temperatures of from 50° C. to 500° C., depending on the precursor mixture used and the intended use of the substrate.

It is preferred that the precursor mixture includes at least one volume percent of the copper(II) β-diketonate precursor in the vapor state. The volume percentage ratio of the at least one copper(II) β-diketonate to the at least one copper(I) β-diketonate is preferably from about 1:99 to about 50:50.

While any of a number of suitable combinations of copper (I) β-diketonates and copper(II) β-diketonates may be used, exemplary preferred mixtures according to the present invention include a mixture of copper(I) (hexafluoroacetylacetonate)(trimethylvinylsilane) and anhydrous copper(II)(hexafluoroacetylacetonate)$_2$ in a volume percentage ratio of copper (II) precursor to copper (I) precursor of from about 1:99 to about 65:35, and more preferably from about 5:95 to about 50:50. A further preferred mixture having at least three components includes (1) from 98 to about 50 volume percent, and more preferably from about 94 to 70 volume percent of copper(I) (hexafluoroacetylacetonate) (trimethylvinylsilane); (2) from about 1 to about 25 volume percent, and more preferably from about 5 to 20 volume percent anhydrous copper(II) (hexafluoroacetylacetonate)$_2$; and (3) from about 1 to about 25 volume percent, and more preferably from about 1 to about 10 volume percent copper(II) (hexafluoroacetylacetonate)$_2$ dihydrate. Another preferred embodiment of a precursor mixture according to the present invention includes a mixture of anhydrous copper(II) (hexafluoroacetylacetonate)$_2$ and copper(I) (hexafluoroacetylacetonate) (vinyltrimethoxysilane) in a volume percentage ratio of from about 1:99 to about 50:50, and more preferably from about 5:95 to about 20:80 of copper(II) precursor to copper(I) precursor.

Other exemplary combinations include mixtures of anhydrous copper(II)(hexafluoroacetylacetonate)$_2$ and copper(I) (hexafluoroacetylacetonate) (vinyltrimethoxysilane) and mixtures of copper(II)tetramethylheptadionate)$_2$ and copper (I)(hexafluoroacetylacetonate)(trimethylvinylsilane). Preferably, each of these mixtures includes at least one volume percent of the copper(II) source precursor and preferably a volume percentage ratio of from about 1:99 to about 50:50 copper (II) β-diketonate source precursor to copper(I) β-diketonate source precursor.

The invention also includes a method for chemical vapor deposition of copper-based films onto a substrate. The method includes introducing into a deposition chamber a substrate, such as the substrates described above; a copper source precursor in the vapor state which includes a mixture of at least one copper(I) β-diketonate precursor and at least one copper(II) β-diketonate precursor; and at least one transport gas. The copper source precursor mixtures may be any of those described above. The reaction substrate temperature is maintained at from about 50° C. to about 500° C. for a period of time sufficient to deposit a copper-based film on the substrate. The copper-based films and types of substrate surfaces (including those which already have a single or multilayered metallic coating) are preferably those described above with respect to the precursor mixtures of the invention.

Under the CVD processing conditions of the invention, the at least one transport gas may include one or more reactant gases, one or more inert gases which may function merely as carrier gases, or combinations of reactant and/or carrier gases. Preferred gases are inert or reactive within the deposition chamber for forming more stable intermediates during deposition. Preferably, if a reactant gas is used for forming a pure copper film, the reactant gas within the transport gas is hydrogen or a vapor phase of a hydrogen-containing reducing agent. If hydrogen is used, it may function as a reducing agent/reactant and as a carrier within the transport gas. However, other inert carrier gas(es) may be included with hydrogen within the transport gas. Other preferred gases for use in the at least one transport gas are nitrogen-containing gases such as nitrogen, ammonia, hydrazine and nitrous oxides, helium, argon, xenon, neon, krypton, carbon monoxide, silane, water vapor and/or mixtures and other combinations thereof. Other compounds which may be provided in vapor form in admixture with the above-noted gases or which may be substituted as a transport gas carrying out either a carrier and/or reactant gas function include alkenes, such as trimethylvinylsilane, vinyltrimethoxysilane, 1-pentene and other straight chain, branched or cyclic alkenes, and 1,5-cyclooctadiene; alkynes, such as 3-hexyne; phosphines such as trimethylphosphine; carbonyls such as acetyltrimethylsilane; hydrated diketones such as hexafluoroacetylacetonate hydrate and acetylacetonate hydrate; and mixtures thereof. Additional to such other compounds which may be provided in vapor phase to the transport gas, or used in place of such compounds, alkanols and other solvents may be used, including dienes, silylated olefins, acetylene, ethers such as diallylether and tetrahydrofuran, ethanol, methanol, isopropanol, acetone and/or hexane and other similar compounds. The transport gas(es) may be varied depending on the particular process parameters used and the type of resulting copper-based film desired. In addition, the gases may be added with the precursor mixture and/or added separately into the deposition chamber.

Soft bases, such as those mentioned above with respect to the copper(I) β-diketonate precursors as stabilizing ligands, may be provided to the precursor and/or transport gas entering the deposition chamber as well as, for example, high electron density ligands, weak nucleophiles such as alkenes, alkynes, phosphines, carbonyls, hydrated diketones and mixtures thereof as mentioned above. Such compounds may also be introduced by dissolving them in the source precursor mixture and vaporizing the mixture such that the compound is delivered along with the vapor state precursor mixture as opposed to being provided as an additional gas(es) in the at least one transport gas.

The chemical vapor deposition method used in the method of the present invention may be thermal or plasma-promoted CVD. "Thermal" CVD as used herein is intended to describe a CVD process in which all components are introduced to the chamber in gaseous form and the energy needed for bond cleavage is supplied completely by thermal energy. "Plasma-promoted" CVD as used herein is intended to describe a CVD process in which all components are introduced into the reactor in gaseous form, and the energy needed for bond cleavage is supplied in part by high energy electrons formed in a glow discharge or plasma having a plasma power density of from about 0 to about 100 W/cm$^2$. Plasma-promoted CVD takes advantage of the high energy electrons present in glow discharge to assist in dissociation of gaseous molecules, as is the case of plasma-enhanced CVD, a known CVD technique. Contrary to plasma-enhanced CVD, which uses high plasma power densities, the low power densities used in plasma-promoted CVD do not cause premature precursor decomposition in the gas phase, thereby preventing undesirable film contamination. The use of low power plasma density also prevents electrical damage to the film and substrate. In the method of the present invention, it is preferred that the plasma power density be from about 0.01 W/cm$^2$ to about 10 W/cm$^2$, and more preferably the density should be less than 0.5 W/cm$^2$.

According to a preferred embodiment of the method of the invention, a copper film is deposited by thermal CVD on a substrate. The source precursor mixture, the at least one transport gas, and the substrate are maintained in the reaction chamber at an interior reaction substrate temperature of from about 75° C. to about 500° C. and preferably at least 100° C. The components are maintained under these conditions for a period of time sufficient to deposit a pure copper or other copper-based film on the substrate, preferably for about 10 seconds to about 30 minutes depending on the processing conditions used and the desired film thickness. Preferably, the copper-based film is deposited using thermal CVD having as the at least one transport gas either hydrogen; a mixture of hydrogen with nitrogen, ammonia, argon, xenon and/or hydrazine; a mixture of nitrogen with ammonia, argon and/or xenon; or a mixture of ammonia with argon and/or xenon.

In a further preferred embodiment of the method according to the invention, plasma-promoted CVD is used to deposit a copper-based film on a substrate. The source precursor mixture, the at least one transport gas and the substrate are maintained in the chamber at an interior reaction substrate temperature of from about 50° C. to about 500° C., and preferably at least 75° C. In using plasma-promoted CVD, it is preferred that the plasma provided to the chamber has a plasma power density of from about 0.01 to about 10 W/cm$^2$ and a frequency of preferably from about 0 Hz to about 10$^8$ Hz. The conditions are maintained for a period of time sufficient to deposit pure copper or other copper-based film onto the substrate, preferably from about 10 seconds to about 30 minutes depending on the processing conditions and the desired film thickness. The copper-based film is preferably deposited using as the at least one transport gas hydrogen; a mixture of hydrogen with nitrogen, ammonia, argon, xenon and/or hydrazine; a mixture of nitrogen with ammonia, argon and/or xenon; or a mixture of ammonia with argon and/or xenon.

The method of the invention may be used to prepare pure (electronic grade) copper films which may be used, among other things, as interconnects which are signal-carrying conductors across metallization levels in a computer chips, or as plugs which are signal-carrying conductors which connect two different levels in a computer chip. Conformal deposition of metals by plating techniques, such as electroless plating of copper where the seed layer activates the electroless deposition of copper.

Any CVD reactor having the following basic components may be used as the reactor in the method for copper-based films according to the invention: a precursor delivery system for storing and controlling the delivery of the source precursor, a vacuum chamber, a pumping system for maintaining an appropriately reduced pressure, a power supply for creating plasma discharge (when using plasma-promoted CVD), a temperature control system, and gas or vapor handling capability for metering and controlling the flow of reactants and products resulting from the process. The precursor delivery system may be a pressure-based bubbler or sublimator, a hot-source mass flow controller, a liquid delivery system, a direct liquid injection system, or other similar apparatus.

When depositing copper-based films according to the method, the source precursor mixture is preferably placed in a reservoir which may be heated by a combination of resistance heating tape and associated power supply to a temperature which is high enough to ensure the precursor's sublimation or vaporization, but not so high as to cause premature decomposition of the precursor. Such temperature will vary depending upon the physical properties of the precursor mixture. A mass flow controller, which may be isolated from the reservoir by a high vacuum valve, is preferably provided to control gas flow into the reservoir. Various carrier gases may be used, such as hydrogen, helium, argon, xenon, and/or nitrogen, when a conventional pressure- and/or temperature-based mass flow control delivery system is used as the delivery system for the source precursor mixture into the deposition chamber. Such gases may also function as pressurizing agents when using a liquid delivery system. Liquid delivery systems may include a combination micropump and vaporizer head. A preferred example of a delivery system for the copper source precursor mixture is a hot source mass flow controller, for example, an MKS Model 1150 MFC which does not require the use of a carrier or pressurizing gas. Another example includes a solid source delivery system such as the MKS 1153 system which also does not require use of a carrier gas or pressurizing gas for delivery.

In one preferred embodiment of the method of the present invention, the copper source precursor mixture, in vapor form, or a mixture of the copper source precursor and any transport gas combined with the source precursor, are transported into the CVD reactor through delivery lines which are preferably maintained at the same temperature as the reservoir, using a combination of resistance heating tape and an associated power supply to prevent precursor recondensation. The CVD reactor may be an eight-inch wafer, cold-wall stainless steel CVD reactor preferably equipped with plasma generation capability. The plasma may be generated by various sources, such as direct current plasma, radio frequency plasma, low frequency plasma, high density plasma, electron cyclotron plasma, inductively coupled plasma, microwave plasma or other similar sources. The plasma may be used for dual purposes such as for in situ pre-deposition substrate cleaning and/or for actual deposition if using plasma-promoted CVD.

The reactor is preferably also equipped with an electrical bias on the substrate. The bias can be derived from direct current, a low radio frequency of from less than about 500 kHz to about 10$^6$ kHz, or a microwave frequency of from about 10$^6$ to about 10$^8$ kHz or from other suitable sources.

Evacuation of the CVD deposition reactor may be accomplished by various pumping systems. Suitable pumping systems include a high vacuum (10$^{-6}$ torr or less) pumping system, which may use either a cryogenic-type or a turbomolecular-type pump. Such a system ensures a high vacuum base pressure in the reactor. A vacuum system having a roots blower or dry pump may also be used for handling the high gas throughput during CVD runs. The high vacuum system and the roots blower or dry pump system are both preferably isolated from the CVD reactor by high vacuum gate valves.

The CVD reactor is preferably equipped with a high vacuum load-lock system for transporting and loading substrates as large as about 500 mm wafers into the reactor. The reactor may also interface with a vacuum central handling unit which may be used to transfer the substrate between multiple CVD reactors to deposit sequential or alternating layers of pure copper or other copper-based films and single or multilayered metallic coatings such as those described above.

After being charged to the reservoir, the copper source precursor mixture is heated to a temperature high enough to ensure the precursor's sublimation or vaporization, but not so high that the precursor would be prematurely decomposed. Preferably, the source precursor is heated to a temperature of from about 30° C. to about 100° C. When conventional pressure-based and/or temperature-based, mass flow control-type delivery systems or solid-source-type delivery systems are used to control the flow of precursor into the CVD reactor, the liquid in the reservoir is generally at room temperature. In a liquid delivery system, the vaporizer head, not the liquid in the reservoir, is heated to a temperature high enough to ensure sublimation or vaporization without causing decomposition.

When a gas delivery system is used, any gaseous substance may be used which is substantially inert to the source precursor mixture or which reacts with the source precursor to form one or more intermediates which are more easily transported to the reaction zone and/or which could more readily decompose to yield the desired pure copper or other copper-based film. Exemplary gases for use in gas delivery systems include those listed above as transport gases. Hydrogen is particularly preferred as a carrier gas in a gaseous delivery system for both thermal CVD and plasma-promoted CVD. The flow rate of the gas in the gaseous delivery system for either plasma-promoted or thermal CVD preferably varies from about 10 standard $cm^3$/min to about 25 standard 1/min, and preferably from about 10 to about 5000 $cm^3$/min.

For all delivery modes, the flow rate of the vapor of the source precursor could range from about 0.01 to about 5000 standard $cm^3$/min, preferably from about 0.1 to 2000 standard $cm^3$/min.

The transport gas for forming pure copper films according to the method of the invention may be any of those described above, and is preferably hydrogen for both thermal CVD and plasma-promoted CVD. Argon or nitrogen, singly or in mixture with hydrogen are preferred transport gases for thermal CVD and plasma-promoted CVD of other copper-based films. The flow rate of the at least one transport gas is preferably from about 10 standard $cm^3$/min to about 10 standard 1/min, and more preferably, from about 100 standard $cm^3$/min to about 5 1/min. The corresponding reactor pressure is preferably from about 10 mtorr for low pressure to about 1000 torr for atmospheric pressure CVD, and more preferably from about 100 mtorr to about 15 torr.

While the at least one transport gas may include one or more carrier or reactant gases, it should be understood that the function of the gases is determined by the type of gases being used, the type of precursor mixture, the type of CVD and the associated process parameters. Carrier gases while performing the function of transporting the copper source precursor vapor to the substrate may also undergo reaction in the chamber during deposition. Further, so-called reactant gases may include inert components and some or all of the gas may function merely to dilute the reactive atmosphere in the deposition chamber or to provide the sufficient reaction pressure level. Therefore, the function of the gases may overlap. However, all gases used in the at least one transport gas function to assist the copper source precursor vapor in reaching the substrate. For example, hydrogen may be used as a sole transport gas in plasma-promoted CVD to assist the copper source precursor vapor in reaching the substrate. However, the hydrogen also acts as the catalyzing agent to decompose the precursor on the substrate. Hydrogen may also be used in plasma-promoted CVD as the sole reactant and carrier gas in the transport gas. Hydrogen could also be introduced simultaneously with an inert gas such as neon, argon, helium, krypton and/or xenon to form the transport gas mixture, with hydrogen functioning specifically as a reactant gas while the inert gas(es) function as carriers within the transport gas.

Copper-based films which are pure copper films may also be prepared using thermal CVD based on the method of the present invention. To prepare a pure copper film, it is preferred that hydrogen, argon, helium and/or xenon, preferably hydrogen, are introduced as the at least one transport gas and function as the reactant in the deposition chamber. Hydrogen and/or an inert gas, preferably argon, may also be used separately or within the at least one transport gas as a carrier gas for the precursor vapor. Preferably hydrogen and argon are used in combination as the at least one transport gas and function as a reactant and a carrier gas, respectively.

Plasma-promoted CVD can be used in accordance with the present invention to incorporate carbon in the copper-based films, i.e., to produce carbon-doped copper-based films for use, for example, as substitutes for metallic layers, as barrier layers or conductive layers. The carbon source may be derived from one or more of the gases provided as precursors, or from additional gases in the transport gas having carbon-based structures. Fluorine may also be incorporated in the copper-based films in accordance with the invention. The fluorine source may be derived from one or more of the gases provided as precursors, or from additional gases in the transport gas having fluorine-based or fluorine-substituted structures. A nitrogen-containing gas, helium and/or argon is preferably used as the at least one transport gas for forming carbon-doped copper films, wherein these gases function as a reactant gas. These gases may also function as the source precursor vapor carrier gas within the at least one transport gas. Such transport gases are also useful for forming fluorine-doped copper films, however, additional gases may include fluorinated transport gases or a mixture of the transport gases noted above with fluorinated transport gases. The transport gases for either carbon- or fluorine-doped films are preferably a nitrogen-containing gas alone or in combination with hydrogen, and they may be added separately or simultaneously with the source precursor vapor into the deposition chamber. Such carbon or fluorine doping of the film occurs by use of an increased plasma power density, preferably in the range of 10 W/$m^2$ to about 5 W/$m^2$ such that the bond cleavage between the copper atom and the remainder of the precursor molecule is not necessarily severed as cleanly in all instances as is the case using the lower plasma power density. As a result of either increased plasma power density, residual carbon or fluorine from the precursor molecule is incorporated to a larger degree into the film.

Copper-based films doped with carbon or fluorine may also be prepared using thermal CVD by increasing the substrate temperature to levels of at least about 450° C., and preferably at least about 500° C. For such thermal CVD processes, the at least one transport gas is preferably a nitrogen-containing gas, helium and/or argon, wherein one or more of these gases functions as a reactant gas in the chamber, and, in the case of fluorine-doping, an additional fluorinated gas may be used as either a reactant and/or carrier gas within the transport gas. Hydrogen, nitrogen, helium or an inert gas such as argon or xenon may be used as carrier gases within the at least one transport gas and combined with one or more of the preferred reactant gases. Preferably, the transport gas includes a hydrogen carrier gas and helium as a reactant gas. The carbon-doped and fluorine-doped copper-based films may be used in the manner of the copper-based films described above, particularly in conjunction with other metallic layers such as tantalum-based, titanium-based or tungsten-based layers, or may be themselves used as an adhesion layer or barrier layer as well as a conductive layer on the substrate.

Preferred exemplary copper source precursor vapors and transport gas combinations for use in the method of the present invention include a precursor mixture of anhydrous copper(II)(hexafluoroacetylacetonate)$_2$ and copper (I) (hexafluoroacetylacetonate)(trimethylvinylsilane) with a hydrogen transport gas. A further such combination includes anhydrous copper(II)(hexafluoroacetylacetonate)$_2$, copper (II)(hexafluoroacetylacetonate)$_2$ dihydrate, and copper(I) (hexafluoroacetylacetonate)(trimethylvinylsilane) using hydrogen, argon or a mixture of hydrogen and argon as the transport gas. Also preferred is a mixture of anhydrous copper(II)(hexafluoroacetylacetonate)$_2$ and copper(I) (hexafluoroacetylacetonate) (vinyltrimethoxysilane) using hydrogen, argon or a mixture of hydrogen and argon as the transport gas.

The invention will now be further illustrated in accordance with the following non-limiting examples:

EXAMPLE 1

A 22-liter, 4-neck flask was equipped with a heating mantle, pot thermometer, 1-liter addition funnel and a Dewar condensor. The flask was purged with nitrogen and then maintained under a positive pressure of nitrogen during the course of the preparation. The flask was charged with 9 liters of tetrahydrofuran, 1030.3 g of copper(I)oxide powder, and 1443.5 g of vinyltrimethylsilane. Agitation was commenced. Dropwise addition of 2996.1 g of anhydrous hexafluoroacetylacetone was completed over two hours. The temperature of the mixture rose to 45–50° C. The color changed from copper-red to green-brown. The mixture was stirred overnight. The addition funnel and Dewar condensor were then removed from the flask and a concentrating head was mounted. Under a vacuum of 110–150 torr, the mixture was stripped of volatiles to a maximum pot temperature of 50° C., removing about 8 liters of volatile materials. The solution was then transferred through a glass-frit to a 12 liter distillation flask, removing about 100 g of unreacted copper (I)oxide. The filtered solution was dark green. Vacuum of 20 mm was applied and the balance of tetrahydrofuran and other volatile materials were removed at 20–25° C. Vacuum was then increased to 0.025 torr. Maximum pot temperature was 90° C. The main product cut distilled at 60° C. at 0.025 mm. About 400–600 g of less volatile copper(II) hexafluoroacetylacetonate complexes remained in the flask. The distilled product cut was 3.5 kg of a 10–20% solution of copper(II)(hexafluoroacetylacetonate)$_2$ in copper(I) (hexafluoroacetylacetonate)(vinyltrimethylsilane). The solution was characterized by elemental analysis, gas chromatographic spectroscopy, and infrared spectroscopy. The mixture exhibited moderate sensitivity to air, degrading at less than 1% in an hour.

EXAMPLE 2

Plasma-promoted CVD was carried out using a cold-wall plasma-assisted CVD system with computer control. The substrate wafer was placed on top of a copper heater chuck covering a three-zone heater. The chamber was slightly tilted off vertical by 5° to keep the wafer in place.

A Roots blower pump package [Leybold Ruvac 150 backed by a Trivac D30 direct drive pump] was used with the CVD system. The pumping system provided with a maximum pumping speed of 2.265 m$^3$/min for pressures in the range of 0.1 to 2.0 torr. The delivery manifold was redesigned to accommodate an MKS Direct Liquid Injection Delivery System to precisely control the flow of liquid precursor or precursor solution. The system included three major components: a reservoir where the precursor and solvent mixture were kept at room temperature, a thermal vaporizer which was maintained at the precursor sublimation or vaporization temperature, and a micropump which was employed to control the liquid flow into the vaporizer. The system was designed for accurate and reproducible liquid flows in the 0.1–2.5 ml/min range.

To implement the copper plasma-promoted process, the chamber was modified to add a plasma capability. A 0.318 cm thick, 27.94 cm diameter slotted Teflon spacer was constructed to bolt onto the showerhead, and on top of it was bolted a 0.159 cm thick, 22.86 cm diameter slotted copper plate which acted as the plasma electrode. Both pieces were slotted to match exactly the slotting of the showerhead. A plasma power feed-through was machined into the side of the injector manifold.

The system was also used to demonstrate the commercial feasibility of copper plasma-promoted CVD from a mixture of anhydrous copper(II)(hexafluoroacetylacetonate)$_2$ and copper(I)(hexafluoroacetylacetonate) (trimethylvinylsilane). The volume percentage ratio of the two sources was 25:75 for copper(II)(hexafluoroacetylacetonate)$_2$ to copper(I) (hexafluoroacetylacetonate) (trimethylvinylsilane). Typical deposition parameters included a substrate temperature of from 150–200° C., a plasma power density of 0.1–0.5 W/cm$^2$, a precursor liquid flow rate of 0.2–2.5 cm$^3$/min, hydrogen gas flow rates of 250–1500 standard cm$^3$/min, and a working pressure of 0.1–1 torr. Interestingly, the source precursor mixture exhibited reproducible delivery in a wide temperature window, ranging from 45° C. to 75° C., indicating that addition of copper(II) complexes to the copper(I) source precursors allows enhanced chemical stability and enhanced delivery performance, in view of the robust nature and stability in air of the copper(II) β-diketonates.

The plasma-promoted CVD produced copper films were metallic and continuous. The films that were thinner than approximately 1.5 μm were specular on any type substrate, including silicon, silicon dioxide, and titanium nitride. The use of the copper(I) and copper(II) mixture, in conjunction with the plasma-promoted CVD processes of the present invention, thus provides a copper growth process which is relatively independent of the type of substrate used.

Figure 2:
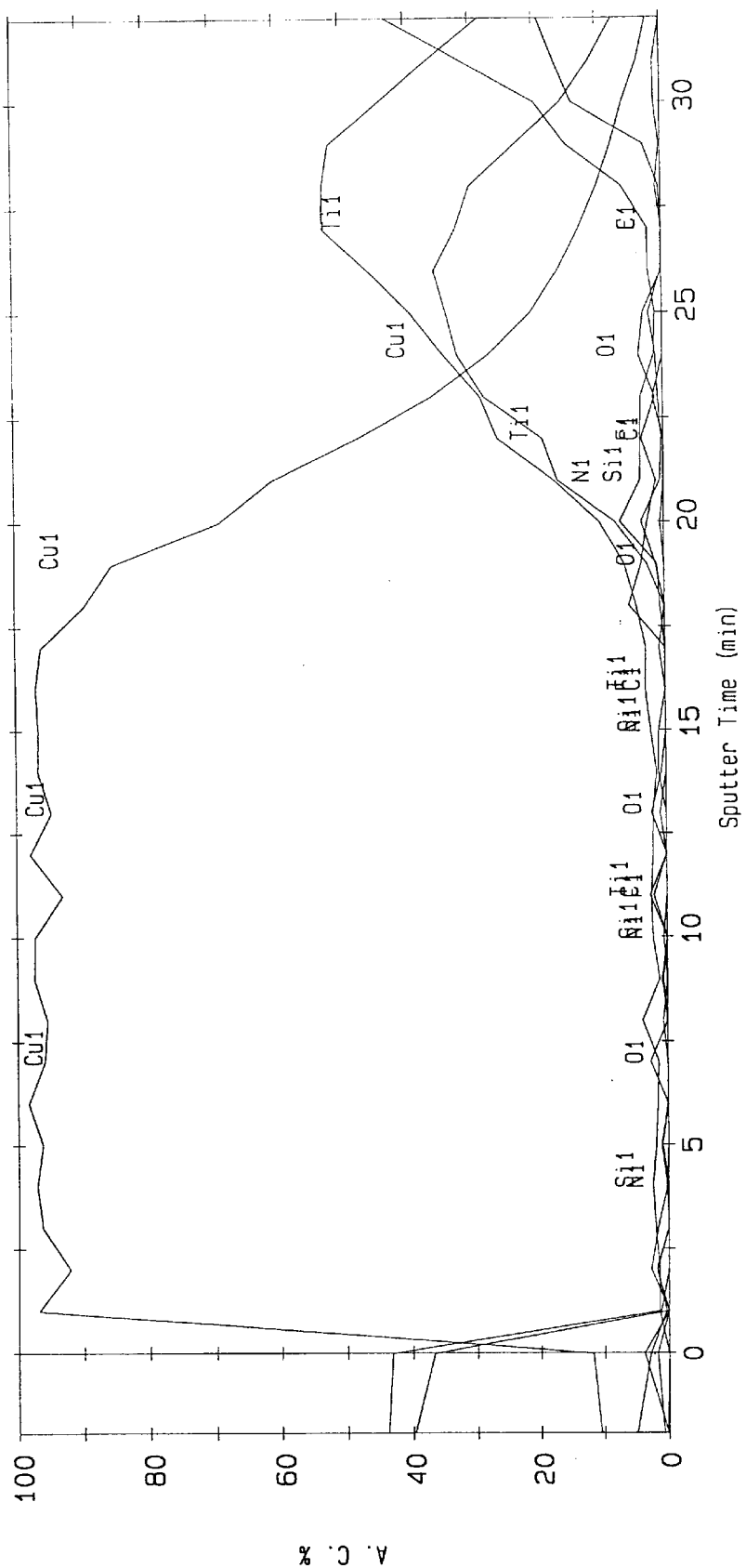
FIG. 2 is a representation of an XPS depth profile spectrum of a copper film produced as described in Example 2.

The resulting films were of high purity, with as-deposited resistivities as low as 1.8 μΩcm, and less than 10% thickness variation, as measured by sheet resistance values, across 200 mm wafers. X-ray photoelectron spectroscopy (XPS) was performed using the Perkin-Elmer Electronics Model 5500 MultiTechnique system. The gold f$_{7/2}$ line at 83.8 eV was taken as a reference peak and the analyzer calibrated accordingly. Survey resolution spectra were obtained using a pass energy of 187.85 eV. A primary x-ray beam (Mg Ka, 1253.6 eV, FWHM=0.8 eV) of 15 KeV and 300 W was employed, and the results were standardized using a bulk oxide-free high conductivity copper sample. FIG. 1 exhibits a typical XPS survey spectrum of the 0–1000 eV binding energy spectrum (ESCA Survey; Area 1; Angle: 55 degrees; Acquisition Time: 2.50 min.; Scale Factor: 22.850 kc/s; Offset: 6.300 kc/s; Pass Energy: 187.850 eV; Aperture: 4; Mg 350 mi). The shape and position of the copper peaks, as well as the absence of carbon, oxygen, or fluorine peaks indicate that, within the detection limits of XPS, the films are made of a pure copper phase. This result was supported by the findings from XPS depth profile analysis of the copper films, which corresponded to a clean copper phase, as shown in the typical high resolution XPS spectrum in FIG. 2 (ESCA Depth Profile Alternating; Area: 1; Species F1; Region 7; Angle: 55 degrees; Sputter Time: 32.00 min.; Scale Factor: 0.040 kc/s; Offset: 0.000 kc/s; Mg 350 mi; Al 300 mi; Ep: 3.00 kV).

Figure 3:
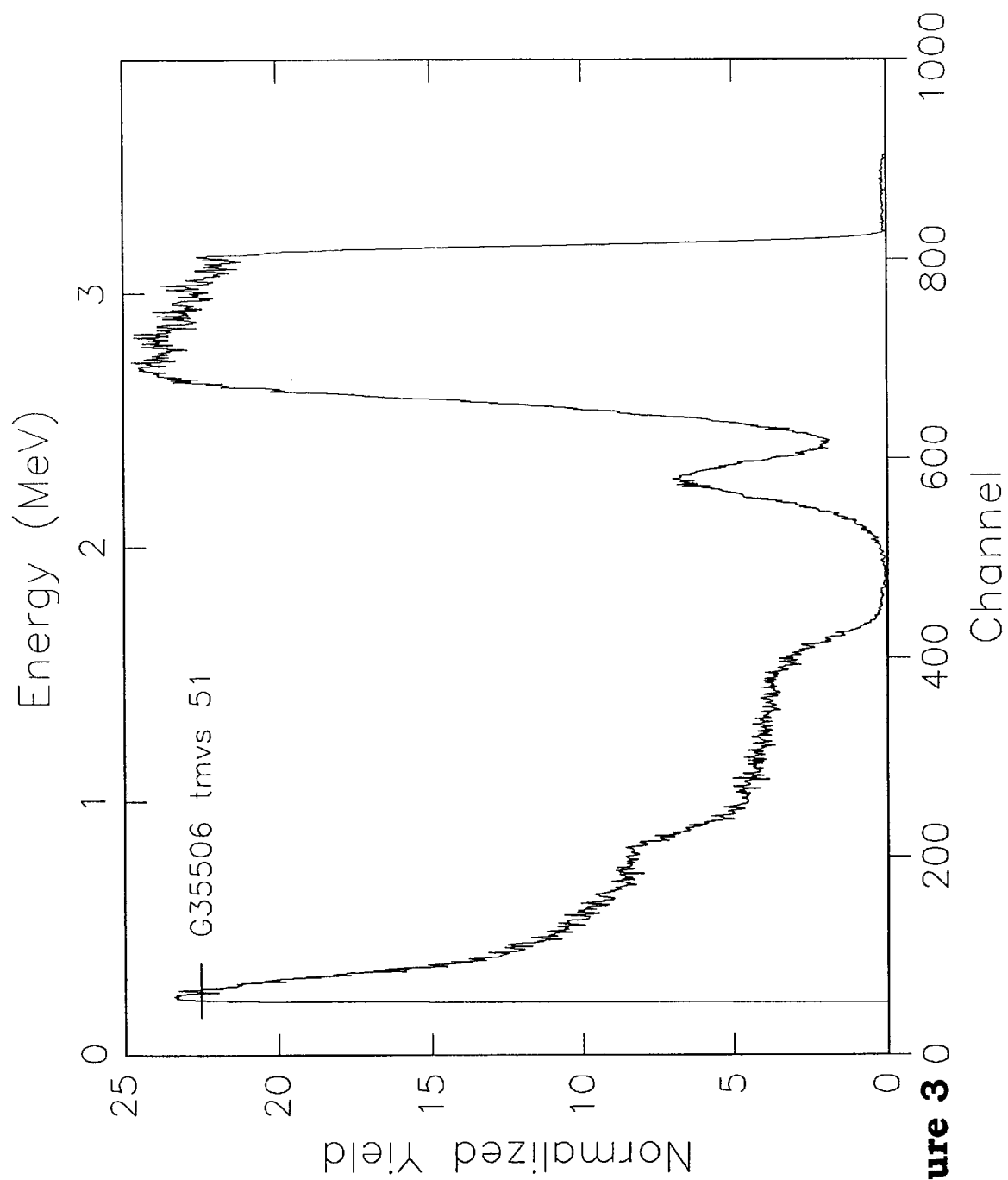
FIG. 3 is a representation of a Rutherford backscattering spectrometry (RBS) spectrum of a copper film produced as described in Example 2.

In addition to thickness measurements, Rutherford back-scattering spectrometry (RBS) was employed for compositional measurements. RBS spectra were taken using a 2 MeV He$^+$ beam and calibrated with bulk samples of copper and silicon. The findings from RBS supported those from XPS regarding the existence of a pure copper phase, with no contaminants observed within the detection limits of RBS, as shown in FIG. 3.

EXAMPLE 3

In this embodiment, a 15.24 cm wafer, cold-wall, custom-made reactor, based on a commercial tungsten CVD Varian 5101 system which was re-designed to perform copper CVD, was initially experimentally used. A particular feature of this system is that the reactor is an inverted design. In this case, the reactants are introduced through the bottom of the reactor and the pumping is accomplished through its top, while the wafer is mounted face down on a graphite chuck. One feature of this set-up is reduced particle contamination on the wafer surface. Another feature is improved flow dynamics at high pressure and flow conditions in comparison to conventional downflow, cold-wall reactor configurations. In such conventional reactors, the temperature increases toward the substrate and the gas expands correspondingly. This temperature variation creates a destabilizing density gradient where the least dense gas molecules are closest to the substrate and the flow is affected by buoyancy force driven convection, which leads to recirculation cells. The presence of recirculation cells usually results in poor uniformity because of reduced mass transfer across the cell, which adjusts only by slow diffusion. Moreover, species trapped in a cell are isolated from the main flow, therefore leading to undesirable variations in gas composition in the reactor. The inverted reactor design provides a solution to this problem, since in that case, the density profile is stable and the buoyancy force acts in the same direction as the main flow. Complications from wafer transport and handling and module interfacing, however, limit the applicability of the inverted reactor design in cluster tool architecture.

The Varian system was modified for copper processing by replacing existing delivery rings for carrier gas and precursor delivery with a cone-shaped showerhead. Such showerhead design allowed for improved reactant mixing prior to introduction into the reaction zone and enhanced film uniformity over 15.24 cm wafers. To maintain process chamber cleanliness, the reactor was equipped with a high-vacuum load lock, capable of handling up to 16 15.24 cm wafers, which could be processed in sequence. Base pressures of $2 \times 10^{-6}$ torr or better were achieved in both the load lock system and reactor by employing two dedicated turbomolecular pumps, each capable of a pumping speed of 220 l/s. Alternatively, process pumping was performed using an Edwards roots blower stack capable of a pumping speed of 1.4×10 l/min to ensure high throughput during the deposition step. The wafer was heated through a quartz window using infrared lamps located outside the chamber, with uniform heat across the wafer surface being achieved by purging the backside of the graphite heater chuck with 30 standard cm$^3$/min nitrogen. Wafer heating was controlled by an electronic temperature controller coupled to a thermocouple set-up embedded into the graphite chuck to provide continuous monitoring of wafer temperature. Actual wafer temperature was pre-calibrated using a temperature monitor wafer. All transport and delivery lines were kept at around 50° C. to prevent recondensation of the copper(I) (hexafluoroacetylacetonate)(trimethylvinylsilane) precursor.

The precursor mixture used included a mixture of anhydrous copper(II)(hexafluoroacetylacetonate)$_2$ and copper(I) (hexafluoroacetylacetonate) (trimethylvinylsilane). The volume percentage ratio of the two sources was 15:85 for copper(II)(hexafluoroacetylacetonate)$_2$ to copper(I) (hexafluoroacetylacetonate) (trimethylvinylsilane). For precursor delivery, an MKS Direct Liquid Injection system was used. It included three major components: a vessel where the precursor was maintained at room temperature under an argon gas pressure of 20 psi; a dual micropump set-up which controlled liquid flow accurately and reproducibly in a range of from 0.01 to 5.00 cm$^3$/min; and a dual vaporizer system which was heated to 50° C. in a hydrogen flow rate ranging from 50 to 800 cm$^3$/min. The use of the precursor mixture yielded significantly improved reliability in precursor vapor delivery to the reaction zone within a wide delivery window (0.01–5.00 cm$^3$/min). This is in contrast to investigations of the delivery of pure copper(I)(hexafluoroacetylacetonate) (trimethylvinylsilane), wherein difficulties were encountered in maintaining flow rates of 1.0 cm$^3$/min or higher for extended periods of time. The problems encountered included early decomposition of precursor in the vaporizer, causing clogging and failure in delivery.

Typical deposition parameters were: a substrate temperature of 135–190° C., a precursor liquid flow rate of 100 to 800 standard cm$^3$/min, and a reactor working pressure of 0.1 torr to 2 torr. Again, the source precursor mixture exhibited reproducible delivery in a wide temperature window, ranging from 45° C. to 75° C., indicating that the addition of copper(II) complexes to the copper(I) source precursors allows enhanced chemical stability and enhanced delivery performance, in view of the robust nature and stability in air of the copper(II) β-diketonates. The substrates used were SEMATECH blanket (non-patterned) titanium nitride (TiN), as well as SEMATECH patterned TiN having 0.35 μm and 0.30 μm trench structures.

The thermal CVD-produced copper films were metallic and continuous. Films thinner than approximately 1.2 μm were specular on any type of substrate, including silicon, silicon dioxide, and titanium nitride. The use of the copper(I) and copper(II) mixture, in conjunction with the thermal CVD processes of the present invention, thus provides a copper growth process which is relatively independent of the type of substrate used.

Figure 4:
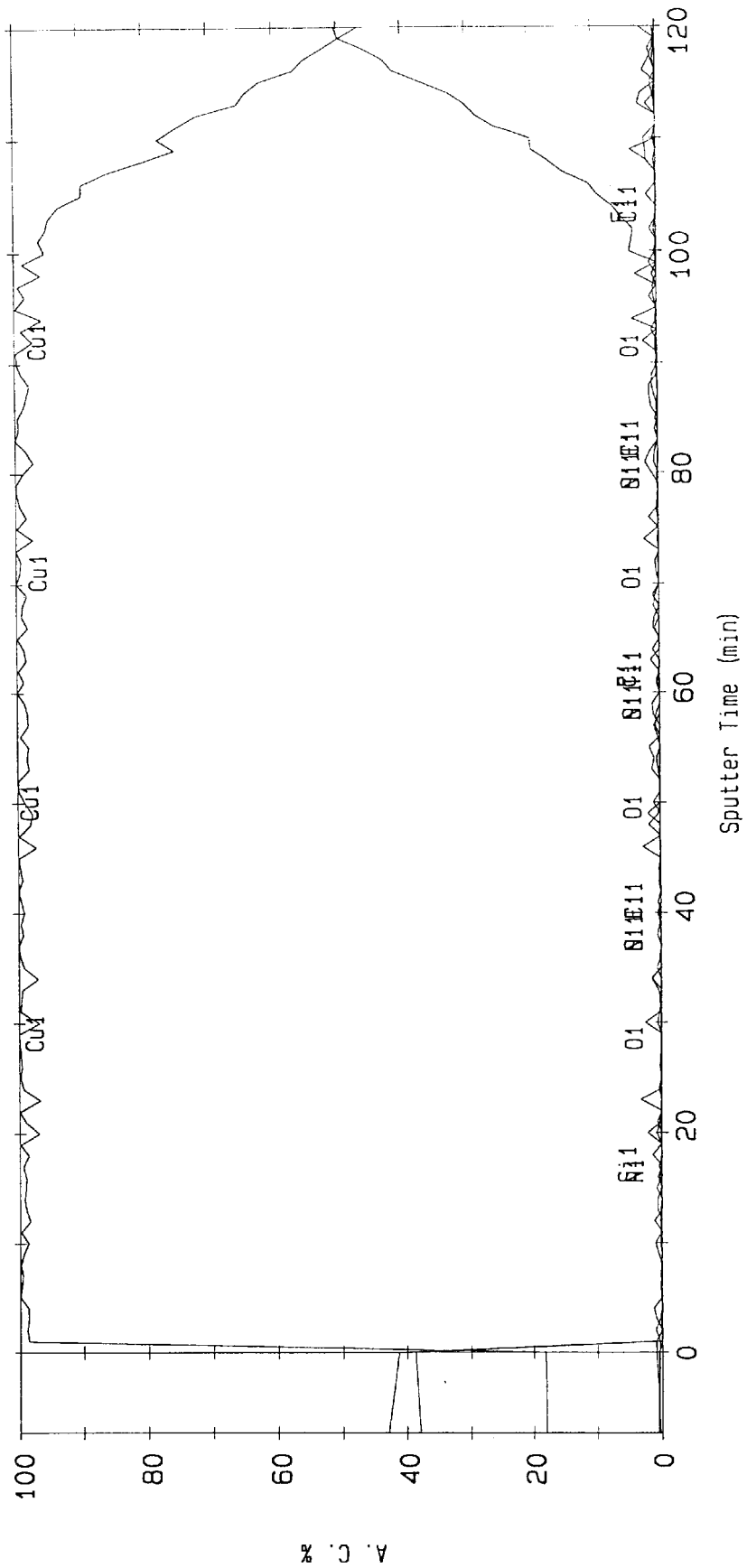
FIG. 4 is a representation of an XPS spectrum of a copper film produced as described in Example 3 in accordance with one embodiment of the present invention.
Figure 5:
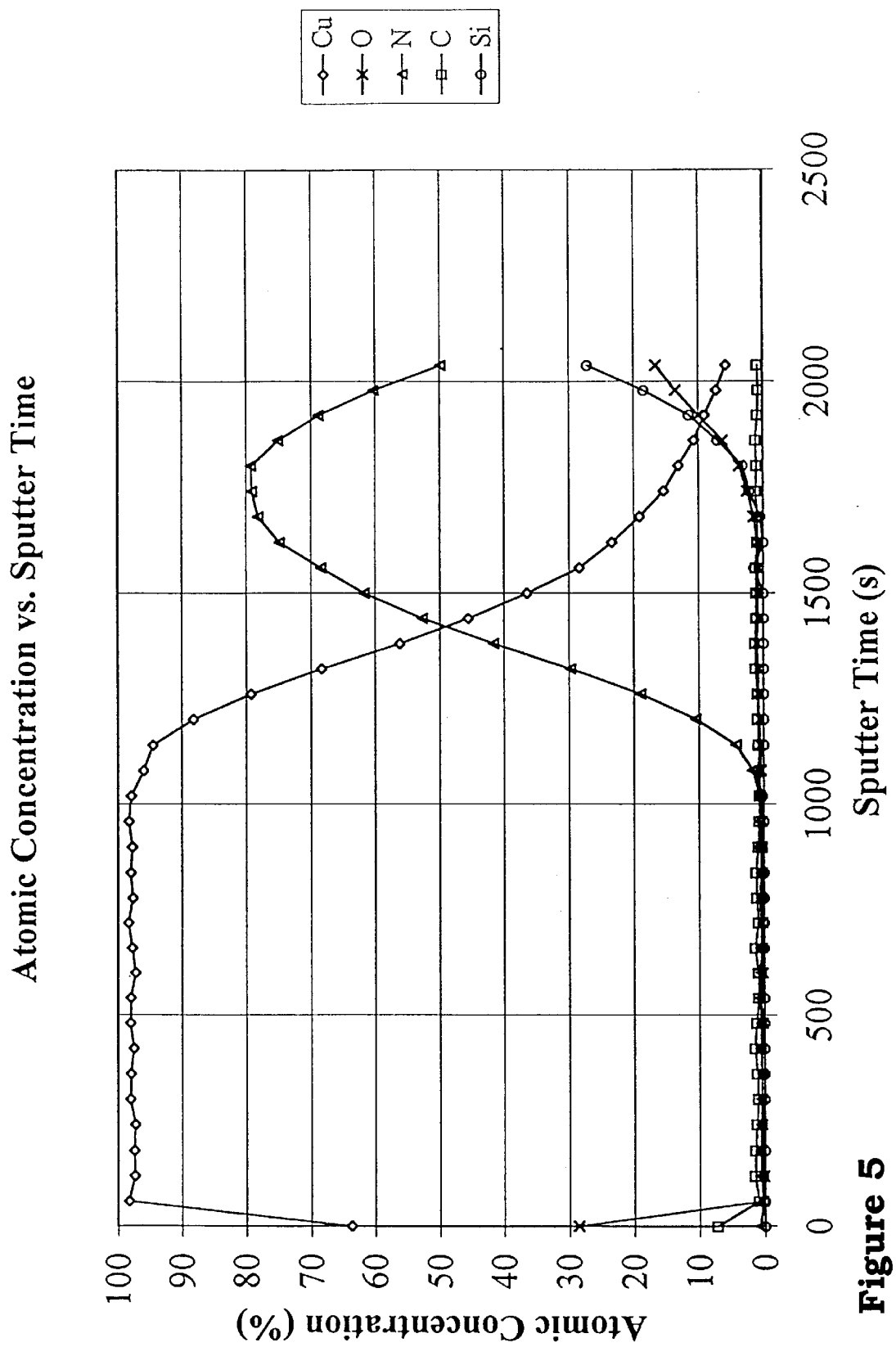
FIG. 5 is a representation of an Auger electron spectroscopy (AES) spectrum of a copper film produced as described in Example 3.
Figure 6:
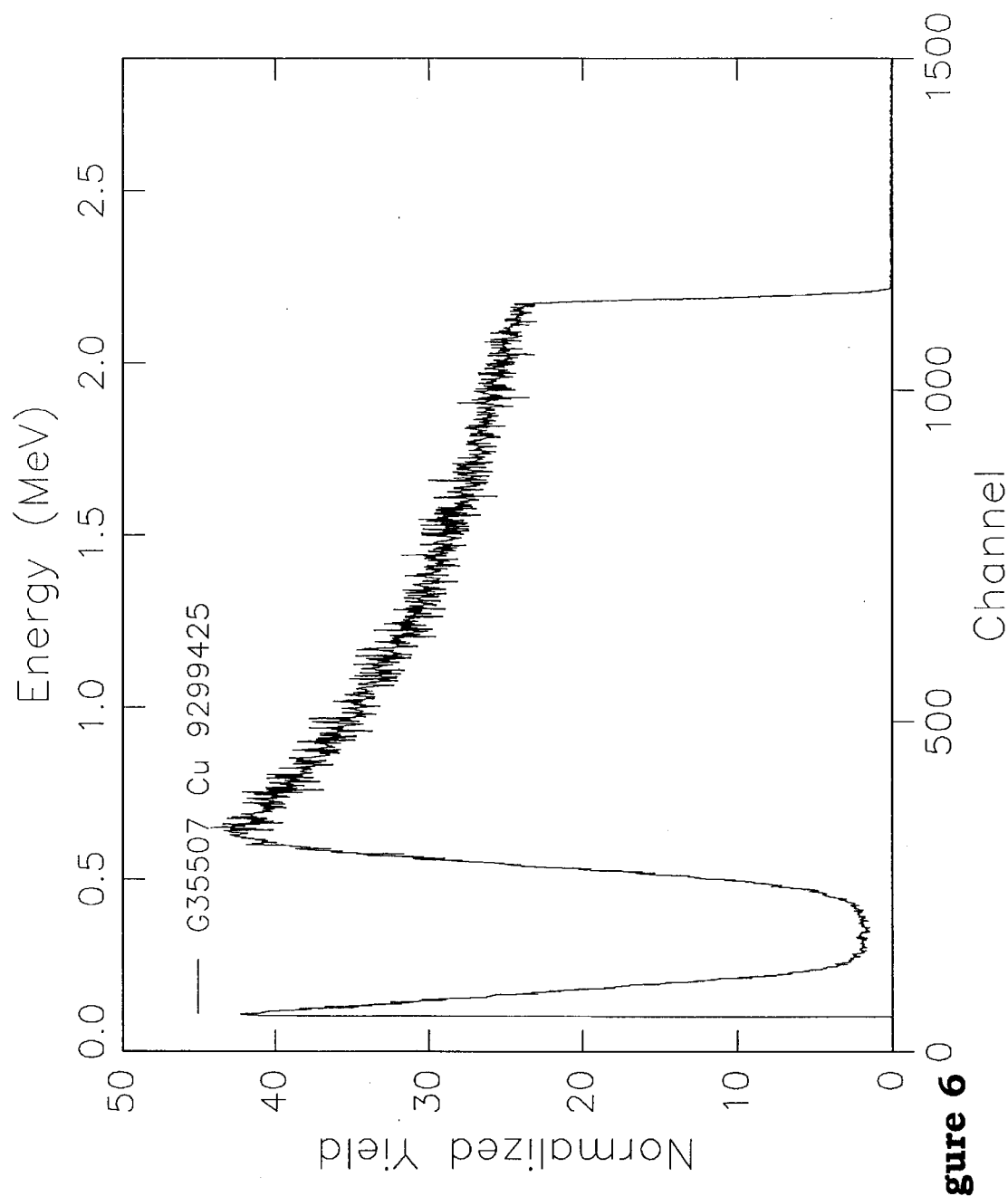
FIG. 6 is a representation of a RBS spectrum of a copper film produced as described in Example 3.
Figure 7:
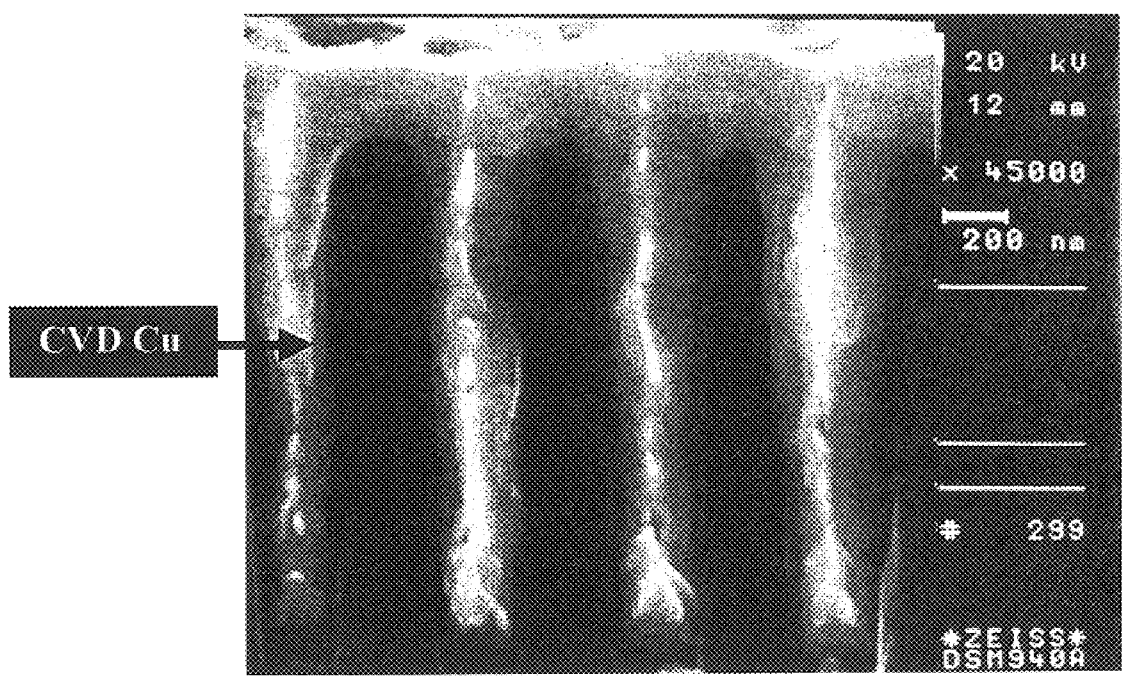
FIG. 7 is a representation of a cross-section scanning electron microscope-magnified view of a silicon substrate upon which oxide via patterns, of nominal diameter of 0.3 μm and nominal aspect ratio of 4:1 are formed, and which have been completely filled with the conformal copper film produced as described in Example 3.

The resulting films were of high purity, with as-deposited resistivities as low as 1.8 μΩcm, and better than 10% uniformity, as measured by sheet resistance values, across 200 mm wafers. The typical high resolution XPS depth profile analysis of the copper films indicated a clean copper phase, as shown in the typical high resolution XPS spectrum of FIG. 4 (ESCA Depth Profile Alternating; Area: 1; Species: F1; Region: 7; Angle: 55 degrees; Sputter Time: 120.00 min.; Scale Factor: 0.040 kc/s; Offset: 0.000 kc/s; Mg 350.m; Al 300.m; Ep: 3.00 kV). This was also supported by Auger electron spectroscopy (AES) depth profile analysis, as displayed in FIG. 5 showing Atomic Concentration plotted against sputter time, and RBS measurements, as shown in FIG. 6. Both RBS and AES supported the XPS findings concerning the formation of a pure copper phase, with contamination levels below the detection limits of the analytical techniques employed. Within the process window investigated, all patterned structures were completely filled regardless of processing conditions. This is documented in the cross-section scanning electron micrograph shown in FIG. 7.

EXAMPLE 4

The precursor mixture used included a mixture of anhydrous copper(II)(hexafluoroacetylacetonate)$_2$ and copper(I)(hexafluoroacetylacetonate) (trimethylvinylsilane), at a volume percentage ratio of the two components of 18:82 copper(II)(hexafluoroacetyl-acetonate)$_2$ to copper(I)(hexafluoroacetylacetonate) (trimethylvinylsilane). For precursor delivery, an MKS Direct Liquid Injection system was used. It included three major components: a vessel where the precursor was maintained at room temperature under an argon gas pressure of 20 psi; a dual micropump set-up which controlled liquid flow accurately and reproducibly in a range of from 0.01 to 1.50 cm$^3$/min, and a single vaporizer system which was heated to 55–60° C. in a hydrogen flow rate ranging from 20 to 250 standard cm$^3$/min.

Typical deposition parameters were: a substrate temperature of 155–220° C., a precursor liquid flow rate of 0.1–1.5 cm$^3$/min, and a reactor working pressure of from 0.1 torr to 1.5 torr. The substrates used were highly aggressive patterned TiN 0.16 μm and 0.20 μm trench structures. In this case, a two-step deposition process was employed. First, a titanium nitride or tantalum nitride diffusion barrier/adhesion promoter layer was deposited in a sputtering modules, then the wafer moved under high vacuum conditions, without exposure to air, to a CVD reactor where copper deposition was performed according to the parameters listed above. The reactors were interconnected through leak-tight transfer arms/load locks which allowed sample transfer between the different reactors without exposure to air.

Figure 8:
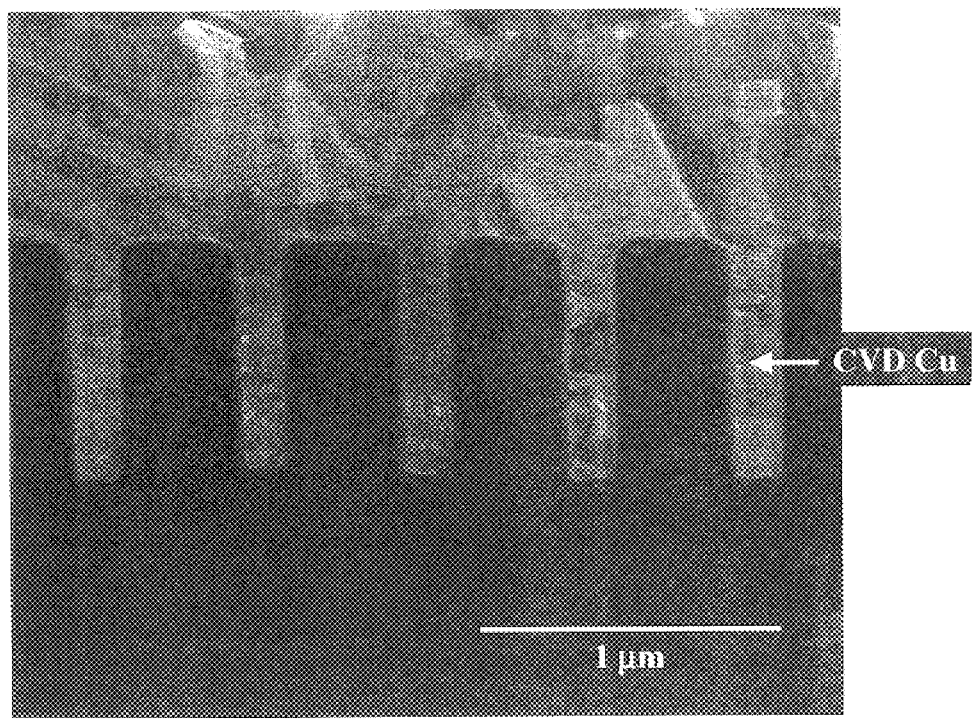
FIG. 8 is a representation of a cross-section scanning electron microscope-magnified view of a silicon substrate upon which oxide via patterns of nominal diameter 0.2 μm and nominal aspect ratio 5:1 are formed and which have been completely filled with the conformal copper film produced as described in Example 4 after in situ deposition of a sputtered tantalum nitride (TaN) diffusion barrier/adhesion promoter layer.
Figure 9:
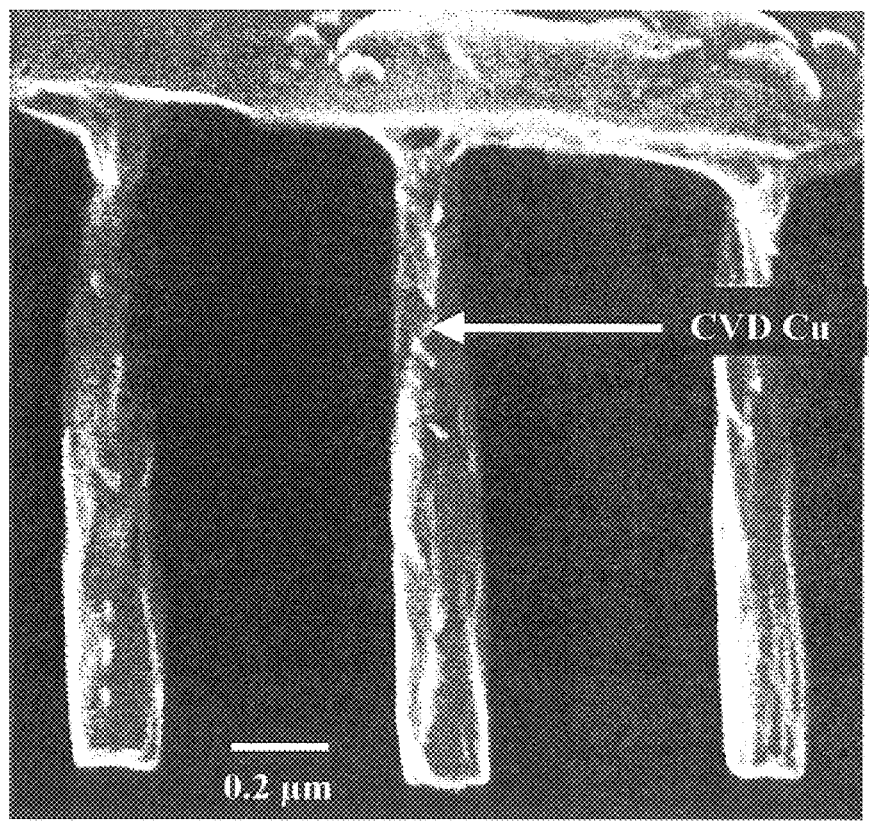
FIG. 9 is a representation of a cross-section scanning electron microscope-magnified views of a silicon substrate upon which oxide via patterns of nominal diameter 0.16 μm (bottom of the structure) and nominal aspect ratio 6:1 are formed and which have been completely filled with the conformal copper film produced as described in Example 4 after in situ deposition of a collimated sputtering titanium nitride (TiN) diffusion barrier/adhesion promoter layer.

The resulting films were analyzed by XPS, AES, RBS, four-point resistivity probe, and cross-section scanning electron microscopy. XPS, AES and RBS indicated a pure copper phase with as-deposited resistivity below 1.9 μΩcm. Cross-section scanning microscopy micrographs, as shown in FIGS. 8 and 9, demonstrated the precursor mixture and associated process ability to completely and reliably fill very aggressive, sub-quarter-micron, device structures. Interestingly, the sequential, in situ, no-exposed wafer processing approach allowed the deposition of highly adherent copper to the underlying TiN and TaN liners.

EXAMPLE 5

In this example, the precursor mixture used included a mixture of anhydrous copper(II)(hexafluoroacetylacetonate)$_2$ and copper(I)(hexafluoroactylacetonate) (trimethylvinylsilane), at a volume percentage ratio of the two sources of 15:82 copper(II)(hexafluoroacetylacetonate)$_2$ to copper(I)(hexafluoroacetylacetonate) (trimethylvinylsilane). For precursor delivery, an MKS Direct Liquid Injection system was employed. It included three major components: a vessel where the precursor was maintained at room temperature under an argon gas pressure of 20 psi, a dual micropump set-up which controlled liquid flow accurately and reproducibly in a range of from 0.01 to 5.000 cm$^3$/min, and a single vaporizer system which was heated to 55–60° C. in a hydrogen flow rate ranging from 20 to 250 standard cm$^3$/min.

Typical deposition parameters were: a substrate temperature of 145–190° C., a precursor liquid flow rate of 0.1–1.5 cm$^3$/min, and a reactor working pressure of 0.5 torr to 1.25 torr. The substrates used were highly aggressive patterned TiN 0.18 μm trench structures. In this case, a two-step deposition process was used. First a tantalum nitride diffusion barrier/adhesion promoter layer was deposited in a sputtering module, then the wafer moved under high vacuum conditions, without exposure to air, to a CVD reactor where copper deposition was performed according to the parameters listed above. The reactors were interconnected through leak-tight transfer arms/load locks which allowed sample transfer between the different reactors without exposure to air.

Figure 10:
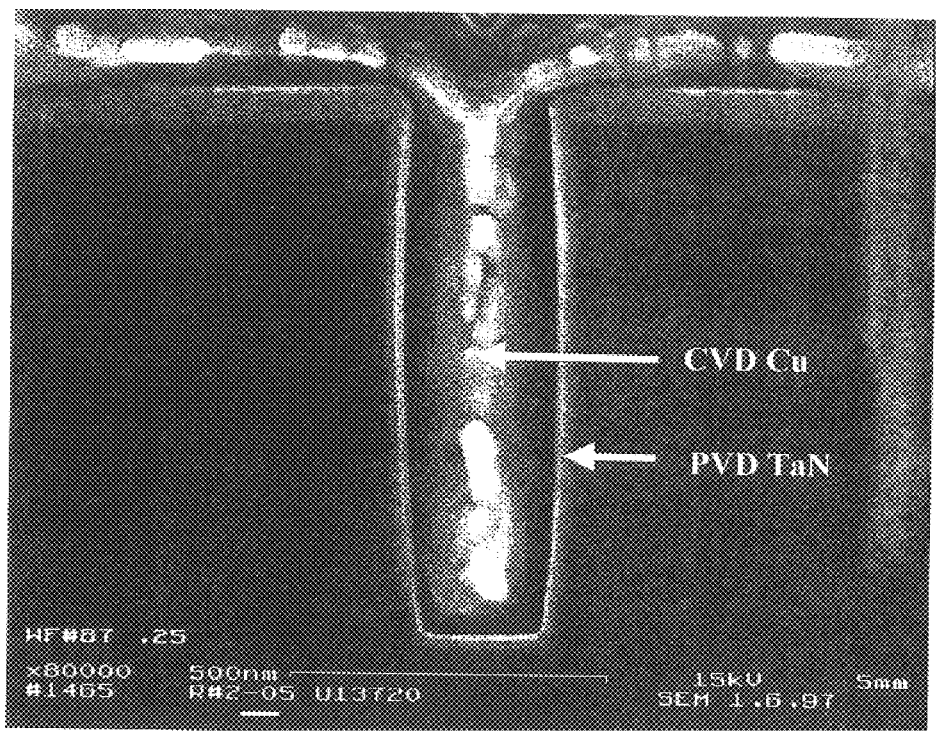
FIG. 10 is a representation of a cross-section scanning electron microscope-magnified views of a silicon substrate upon which oxide via patterns of nominal diameter 0.18 μm (bottom of the structure) and nominal aspect ratio 6:1 are formed and which have been coated with the conformal copper film produced as described in Example 5 after in situ deposition of a sputtered tantalum nitride (TaN) diffusion barrier/adhesion promoter layer.

The resulting films were analyzed by XPS, AES, RBS, four-point resistivity probe, and cross-section scanning electron microscopy. The XPS, AES and RBS indicated a pure copper phase, with as-deposited resistivity below 1.9 μΩcm. The cross-section scanning electron micrograph, as shown in FIG. 10, demonstrated the precursor mixture and associated process ability to completely and reliably provide excellent copper conformality in very aggressive, sub-quarter-micron, device structures. Such conformal copper coatings, as deposited using our precursor layer in the deposition of metals by plating techniques, including the deposition of copper by electroless plating, where the seed layer is needed to activate the electroless deposition of copper.

Interestingly, the sequential, in situ, no-exposed wafer, processing approach allowed the deposition of highly adherent copper to the underlying TaN liner.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A copper source precursor for use in the chemical vapor deposition of films comprising copper, comprising a mixture of (a) at least one ligand-stabilized copper (I) β-diketonate precursor; and (b) at least one copper(II) β-diketonate precursor.

2. The copper source precursor mixture according to claim 1, wherein the at least one copper(II) β-diketonate precursor is at least 1 percent by volume of said mixture.

3. The copper source precursor mixture according to claim 1, wherein said mixture further comprises a solvent selected from the group consisting of a diene, a silylated olefin, and acetylene, and an unsaturated ether.

4. The copper source precursor mixture according to claim 1, wherein the at least one copper(I) β-diketonate has the following formula:

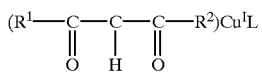

(V)

wherein
- $R^1$ and $R^2$ are independently selected from the group consisting of linear and branched alkyl groups of from 1 to 6 carbon atoms, and fluorine-substituted linear and branched alkyl groups of from 1 to 6 atoms from the group of fluorine and carbon atoms, and
- L is a Lewis base selected from the group consisting of alkenes, alkynes, phosphines, carbonyl, polyethers, and cyclopolyethers; and the at least one copper (II) β-diketonate has the following formula:

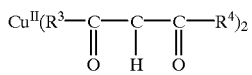

(VI)

wherein
- $R^3$ and $R^4$ are independently selected from the group consisting of linear and branched alkyl groups of from 1 to 6 carbon atoms, and fluorine-substituted linear and branched alkyl groups of from 1 to 6 atoms from the group of fluorine and carbon atoms.

5. The copper source precursor mixture according to claim 1, wherein the mixture comprises copper(I) (hexafluoroacetylacetonate) (trimethylvinylsilane) and copper(II)(hexafluoroacetylacetonate)₂, and a volume percentage ratio of copper(II)(hexafluoroacetylacetonate)₂ to copper(I) (hexafluoroacetylacetonate)(trimethylvinylsilane) is from about 1:99 to 65:35.

6. The copper source precursor mixture according to claim 5, wherein the volume percentage ratio of copper(II) (hexafluoroacetylacetonate)₂ to copper(I) (hexafluoroacetylacetonate)(trimethylvinylsilane) is from about 5:95 to about 50:50.

7. The copper source precursor mixture according to claim 1, wherein the mixture comprises from about 98 to about 50 volume percent copper(I) (hexafluoroacetylacetonate)(trimethylvinylsilane), from about 1 to about 25 volume percent anhydrous copper(II) (hexafluoroacetylacetonate)₂ and from about 1 to about 25 volume percent copper(II)(hexafluoroacetylacetonate)₂ dihydrate.

8. The copper source precursor mixture according to claim 7, wherein the mixture comprises from about 94 to about 70 volume percent copper(I) (hexafluoroacetylacetonate)(trimethylvinylsilane), from about 5 to about 20 volume percent anhydrous copper(II) (hexafluoroacetylacetonate)₂ and from about 1 to about 10 volume percent copper(II)(hexafluoroacetylacetonate)₂ dihydrate.

9. The copper source precursor mixture according to claim 1, wherein the mixture comprises anhydrous copper (II)(hexafluoroacetylacetonate)₂ and copper(I) (hexafluoroacetylacetonate)(vinyltrimethoxysilane) and a volume percentage ratio of anhydrous copper(II) (hexafluoroacetylacetonate)₂ to copper(I) (hexafluoroacetylacetonate)(vinyltrimethoxysilane) is from about 1:99 to about 50:50.

10. The copper source precursor mixture according to claim 9, wherein the volume percentage ratio of anhydrous copper(II)(hexafluoroacetylacetonate)₂ to copper(I) (hexafluoroacetylacetonate)(vinyltrimethoxysilane) is from about 5:95 to about 20:80.

11. A copper source precursor for use in the chemical vapor deposition of films comprising copper, comprising a mixture of
(a) at least one ligand-stabilized copper (I) β-diketonate precursor having the following formula:

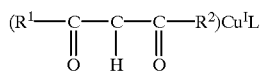

(V)

wherein
- $R^1$ and $R^2$ are independently selected from the group consisting of linear and branched alkyl groups of from 1 to 6 carbon atoms, and fluorine-substituted linear and branched alkyl groups of from 1 to 6 atoms from the group of carbon and fluorine atoms, and
- L is a Lewis base selected from the group consisting of alkenes, alkynes, phosphines, carbonyl, polyethers, and cyclopolyethers; and (b) at least one copper(II) β-diketonate precursor having the following formula:

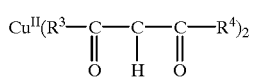

(VI)

wherein
- $R^3$ and $R^4$ are independently selected from the group consisting of linear and branched alkyl groups of from 1 to 6 carbon atoms, and fluorine-substituted linear and branched alkyl groups of from 1 to 6 atoms from the group of carbon and fluorine atoms, wherein the at least one copper(II) β-diketonate precursor is at least 1 percent by volume of said mixture.

* * * * *